(12) United States Patent
Hashimoto et al.

(10) Patent No.: US 7,680,642 B2
(45) Date of Patent: Mar. 16, 2010

(54) EQUIVALENT CIRCUIT FOR COIL INCORPORATED IN CIRCUIT SIMULATOR, CIRCUIT SIMULATOR AND METHOD OF PREPARATION OF SAME, AND STORAGE MEDIUM OF CIRCUIT SIMULATOR PROGRAM

(75) Inventors: Hiroshi Hashimoto, Chiyoda-ku (JP); Hiroyuki Sano, Chiyoda-ku (JP); Tomoyuki Arasawa, Chiyoda-ku (JP)

(73) Assignee: The Japan Research Institute, Limited, Tokyo (JP)

( * ) Notice: Subject to any disclaimer, the term of this patent is extended or adjusted under 35 U.S.C. 154(b) by 873 days.

(21) Appl. No.: 11/319,055

(22) Filed: Dec. 28, 2005

(65) Prior Publication Data

US 2006/0155522 A1    Jul. 13, 2006

(30) Foreign Application Priority Data

Jan. 12, 2005  (JP) ............................. 2005-004738
Oct. 31, 2005  (JP) ............................. 2005-316428

(51) Int. Cl.
*G06F 17/50* (2006.01)

(52) U.S. Cl. ............................. 703/14; 703/2
(58) Field of Classification Search .................. 703/15, 703/18, 14, 2
See application file for complete search history.

(56) References Cited

U.S. PATENT DOCUMENTS 5,111,374 A * 5/1992 Lai et al. ...................... 363/37

(Continued)

FOREIGN PATENT DOCUMENTS

JP  A-8-9676  1/1996

(Continued)

OTHER PUBLICATIONS

The MathWorks, Inc., "SimPowerSystems For Use With Simulink", User's Guide, Version 3, Sep. 2003, pp. i-viii, 1-1-1-8, 2-24-2-27, 2-40-2-45, 2-56-2-59, 4-16-4-19, 5-55-5-67, 5-103-5-107, 5-140-5-142, 5-314-5-315, 5-347-5-356.*

(Continued)

*Primary Examiner*—Paul L Rodriguez
*Assistant Examiner*—Luke Osborne
(74) *Attorney, Agent, or Firm*—Oliff & Berridge, PLC

(57) ABSTRACT

An equivalent circuit for a coil incorporated in a circuit simulator is a model of an equivalent circuit for a coil included in a circuit simulator for analysis of an electrical device including a coil forming a magnetic circuit. The equivalent circuit of a coil included in an electric motor or other electrical device is preferably comprised of a resistance component (R), induced voltage component ($-d\Phi/dt$), and inductance component (L). The equivalent circuit of the inductance component is provided with a current source, a voltage extractor for extracting the voltage across the terminals of this current source, a current generator for determining the value of the current of the current source based on the value of the voltage output by this voltage extractor, and a current-carrying path connected in parallel to the current source and carrying a regenerative current at the time of off operation. By the above configuration, an electrical device including a coil can be analyzed and the iterative calculation at the time of handling nonlinear characteristic data becomes unnecessary. An actual model can be realized with variable values of the inductance element.

22 Claims, 16 Drawing Sheets

U.S. PATENT DOCUMENTS

| | | | | |
|---|---|---|---|---|
| 5,444,351 | A | * | 8/1995 | Yamamura et al. ........... 318/811 |
| 5,629,603 | A | * | 5/1997 | Kinoshita .................. 180/65.8 |
| 6,008,616 | A | * | 12/1999 | Nagayama et al. ........... 318/773 |
| 7,243,006 | B2 | * | 7/2007 | Richards ..................... 700/286 |

FOREIGN PATENT DOCUMENTS

| JP | A-11-312187 | 11/1999 |
|---|---|---|
| JP | A 2003-075521 | 3/2003 |
| JP | A 2003-085218 | 3/2003 |
| JP | A-2004-235279 | 8/2004 |

OTHER PUBLICATIONS

Chapman, Stephen J., "Electric Machinery Fundamentals", Third Edition, WCB/McGraw-Hill, 1999, pp. 140-142.*

Jun, H., "Behavior-Mode Simulation of Power Electronic Circuits", IEEE Transactions on Power Electronics, vol. 12, No. 3, May 1997.*

Powersim Inc., "PSIM User's Guide", Version 6.0, Jun. 2003, pp. i-40, 103-126, 143-144.*

Kim et al, "Interface Circuits for Regenerative Operation of an Electric Vehicle", Proceedings of the 1996 IEEE IECON 22nd International Conference on Industrial Electronics, Control and Instrumentation, vol. 1, pp. 53-58.*

Mir et al, "Energy Efficient C-Dump Converters for Switched Reluctance Motors", IEEE Transactions on Power Electronics, vol. 12, Issue 5, 1997, pp. 912-921.*

English-language translation of Japanese Office Action mailed on Nov. 9, 2009. Sep. 11, 2004 4 pages Application No. 2005-004738.

* cited by examiner

MODELIZATION OF MOTER MODEL AND PWM WAVEFORM GENERATING PART(PSIM)

MODELIZATION OF MOTOR MODEL AND PWM WAVEFORM GENERATING PART (PSIM)

EQUIVALENT CIRCUIT FOR COIL INCORPORATED IN CIRCUIT SIMULATOR, CIRCUIT SIMULATOR AND METHOD OF PREPARATION OF SAME, AND STORAGE MEDIUM OF CIRCUIT SIMULATOR PROGRAM

CROSS-REFERENCE TO RELATED APPLICATIONS

The present invention contains subject matter related to Japanese Patent Application No. 2005-4738 filed in the Japan Patent Office on Jan. 12, 2005 and Japanese Patent Application No. 2005-316428 filed in the Japan Patent Office on Oct. 31, 2005, the entire contents of which being incorporated herein by reference.

BACKGROUND OF THE INVENTION

1. Field of the Invention

The present invention relates to an equivalent circuit for a coil incorporated in a circuit simulator used for analysis of electrical equipments including an electric motor and a generator, etc., a circuit simulator and a method of preparing the same, and a storage medium for storing a program for realizing the circuit simulator. In particular, the present invention relates to arts for determining the equivalent circuit for a coil being a magnetic circuit in an electrical equipment in order to make a model for analysis by a circuit simulator closer to an actual coil, and arts for improving the performance and practicality of commercially available ordinary circuit simulator programs.

2. Description of the Related Art

When a household electric appliance manufacturer or auto maker, etc. uses, for example, an electric motor in a product, it generally conducts a detailed study of operating characteristics in electrical circuits of the electric motor using a circuit simulator before producing an actual motor. In this case, the circuit simulator treats the electric motor as a device comprised of electrical elements included in the mechanical structural parts and a control circuit for controlling the supply of power to the mechanical structural parts. When the circuit simulator performs calculations for an electric motor, it expresses the electric motor as an electrical equivalent circuit and usually uses electrical elements of the electric motor in the circuit simulator.

The above-mentioned circuit simulator is realized by running a simulation program simulating the configuration and operation of the electrical circuit equivalent to the electric motor on a computer. The operator at the user installs, starts up, and runs the simulation program in the computer, views the state of the electrical equivalent circuit displayed on the screen of the display of the computer, and simulates the operation of the electric motor through the electrical equivalent circuit. The circuit simulator to be used is generally provided by commercially available software. As the circuit simulator, for example, PSIM (made by Powersim Inc.), Matlab®/Simulink® (made by The MathWorks Inc.), and other products are being sold.

The conventional commercially available circuit simulators can set several electrical characteristics for the motor elements. A circuit simulation enables the calculations of the electrical circuit to be matched with the actually measured values to thereby evaluate the performance of a product without manufacturing a trial product. This enables advance evaluation of the performance of the electrical circuit and enables evaluation of the performance by a short calculation time and faster cycle.

However, in the conventional circuit simulator, the set values of the electrical characteristics are constant values based on lumped constants and cannot be changed during the computer simulation. In an actual electric motor, however, the values of the inductance and other electrical characteristics of the motor elements change with each instant. For this reason, the problem has been pointed out that a separation occurs between the results of calculation by the conventional circuit simulator and the actually measured values in actual devices, and the accuracy of calculation is poor.

As a means for solving the above conventional problem, the method has been proposed of analyzing the electrical characteristics of an electric motor in advance utilizing the finite element method (electromagnetic field analysis) so as to obtain data on the constantly changing values of the electrical characteristics of the electric motor and connecting the data of the values of the electrical characteristics to the circuit simulator (Japanese Patent Publication (A) No. 2003-75521 and Japanese Patent Publication (A) No. 2003-85218). Explaining this more specifically, the practice has been to extract the values of the electrical characteristics of the electric motor in accordance with specific situations based on the finite element method, prepare a data base of the values of the electrical characteristics, and have the circuit simulator run calculations while referring to the data base.

Magnetic field analysis based on the finite element method enables analysis of the characteristics of the mechanical structural parts of the electric motor as they stand, but tremendous time is taken if finding them directly linked with the electrical circuit.

Further, when connecting magnetic field analysis by the finite element method and the circuit simulator, as explained above, there is the problem that the work of extracting the data of the electrical characteristics in advance is required. Further, while a data base of the electrical characteristics is prepared, the data base has nonlinearity, so iterative calculation by the circuit simulator is necessary. Therefore, when it is not possible to run nonlinear iterative calculations on the circuit simulator, data of nonlinear characteristics cannot be handled.

Ordinarily, the only variable circuit elements which a conventional commercially available circuit simulator provides the user are the current source and voltage source. There are no variable inductance elements etc. However, the actual characteristics of a coil forming a magnetic circuit handled in an electric motor or other electrical devices or equipments are not constant values, but variable values, so some sort of modelization is necessary for inherently variable inductance elements to be handled by a circuit simulator.

Further, the circuit simulator of an electrical device having three coils connected by a Y-configuration (star configuration) or a delta configuration inherently functions as an electric motor or functions as a generator in accordance with the relative magnitude of the power supplied from the outside and the power generated at the coil side. For this reason, when using the above circuit simulator for analysis, setting the analysis conditions of the model so as to select between simulation and analysis as an electric motor or simulation and analysis as a generator becomes extremely important. From this viewpoint, provision of a circuit simulator enabling the analysis conditions to be suitably set has been desired.

SUMMARY OF THE INVENTION

An object of the present invention is to provide an equivalent circuit for a coil, a circuit simulator, and a method of preparation of a circuit simulator enabling analysis of an electrical device including a coil, elimination of the need for iterative calculation when handling data of nonlinear characteristics relating to the coil, realization of an actual model having a variable value of an inductance component, and a much higher general applicability.

Another object of the present invention is to provide a storage medium storing a program for realizing a circuit simulator having the above characteristics by utilizing commercially available circuit simulator software.

Still another object of the present invention is to provide an equivalent circuit for a coil enabling, in the circuit simulator of an electric motor, generator, or other electrical device, to control the current to be strictly zero so as to stabilize a system in the case of a non-current carrying state in accordance with the states of the different phases of the three-phase alternating current supplied as an excitation current, to accurately express the drive state near to real devices for the electric motor or generator, etc. to be calculated, and to handle a Y-configuration or delta configuration of excitation coils, and such a circuit simulator.

The equivalent circuit for a coil according to the present invention is incorporated in a circuit simulator for analyzing an electrical device including a coil forming a magnetic circuit and expresses the equivalent circuit of the coil by an inductance component.

The model of the equivalent circuit for a coil is comprised by the inductance component and improves the connectivity with a commercially available circuit simulator for analysis of an electrical device including a coil and enables the analysis capability of the circuit simulator to be fitted to the actual device. The above electrical device is an electrical device including a coil forming a magnetic circuit as a part and is typically an electric motor.

In the equivalent circuit for a coil according to the present invention, preferably the equivalent circuit of the inductance component is provided with a current source, a voltage extractor for taking out a voltage across terminals of the current source, a current generator for determining a value of the current of the current source based on the value of the voltage output from the voltage extractor, and a current-carrying path connected in parallel to the current source and carrying a regenerative current at the time of off operation. According to this configuration, it becomes possible to make the value of the inductance component variable and possible to realize a model of an equivalent circuit of an electrical device including a coil reflecting the characteristics of the actual device.

In the equivalent circuit for a coil according to the present invention, alternatively the current-carrying path for carrying the regenerative current is comprised of two current-carrying paths comprised of diodes, resistance elements, and switch elements and opposite in current-carrying direction and is provided with a circuit for controlling the on/off operation of the switch elements of the two current-carrying paths in accordance with the current-carrying direction at the time of off operation.

In the equivalent circuit for a coil according to the present invention, preferably the current generator is a data base expressed with voltage or any other physical quantity as input and a nonlinear electrical characteristic as output current. This data base can handle input of any physical quantity including the value of voltage. Due to this, it can handle any unspecified nonlinear electrical characteristic. Due to this, the inductance component able to be handled in the present invention can be applied without specifying the type of nonlinear characteristic. As the physical quantity, in addition it is possible, as representative examples, to handle the rotational angle or temperature information of a motor, the operating states of other coils, the past current-carrying state, and other unspecified parameters.

In the equivalent circuit for a coil according to the present invention, preferably the equivalent circuit of the coil further includes a resistance component and an induced voltage component. By explicitly expressing the induced voltage component as a term in addition to the inductance component, it becomes possible to calculate the induced voltage. When using a current source to express an equivalent circuit for a coil, since the current source itself is not directly dependent on the voltage, this modelization enables the induced voltage to be found in the no-load state.

The method of preparation of a circuit simulator according to the present invention is a method for analyzing an electrical device including a coil forming a magnetic circuit comprised of a first step of expressing an equivalent circuit for a coil by an inductance component and a second step of connecting the equivalent circuit of the electrical device including the equivalent circuit for a coil to the circuit simulator.

In the method of preparation of a circuit simulator according to the present invention, the equivalent circuit for a coil further includes a resistance component and an induced voltage component.

A computer readable storage medium according to the present invention stores a circuit simulator program for making a computer run a circuit simulator for analysis of an electrical device including a coil forming a magnetic circuit and making the computer realize an equivalent circuit for a coil by an inductance component.

The storage medium according to the present invention, preferably stores a circuit simulator program for making the computer realize an equivalent circuit of an inductance component by a current source, a voltage extractor for extracting a voltage across terminals of the current source, a current generator for determining the value of the current output by the current source based on the value of the voltage output by the voltage extractor, and a current-carrying path connected in parallel to the current source and carrying a regenerative current at the time of off operation.

The storage medium according to the present invention alternatively stores a circuit simulator program for making the computer realize the current-carrying path for carrying the regenerative current by two current-carrying paths comprised of diodes, resistance elements, and switch elements and having opposite current-carrying directions and a circuit for controlling the on/off operations of the switch elements of the two current-carrying paths at the time of off operation in accordance with the current-carrying direction.

The storage medium according to the present invention preferably stores a circuit simulator program for making the computer realize the current generator by a data base expressed with voltage or any other physical quantity as input and with a nonlinear electrical characteristic as output current.

The storage medium according to the present invention preferably stores a circuit simulator program making for the equivalent circuit of the coil include a resistance component and induced voltage component along with the inductance component.

The equivalent circuit for a coil according to another aspect of the present invention is a model of an equivalent circuit for a coil incorporated in a circuit simulator for analyzing an electrical device including a coil forming a magnetic circuit and is comprised of an inductance component, wherein the equivalent circuit of the inductance component is provided with a current source for outputting a current, a voltage extractor for extracting the voltage across terminals of this current source, a current generator for determining the value of the current of the current source based on the value of the voltage output by this voltage extractor, and a resistance element and switch element connected in parallel to the current source.

The model of the equivalent circuit for a coil is comprised of an inductance component, improves the connectivity with a commercially available circuit simulator for analysis of an electrical device including a coil, and enables the analysis capability of the circuit simulator to be fitted to the actual device. The above electrical device is an electrical device including a coil forming a magnetic circuit as a part, specifically is an electric motor or generator. Further, by having the equivalent circuit of the inductance component comprised of a current source, voltage extractor, current generator, and a resistance element and switch element connected in parallel to the current source, it is possible to make the value of the inductance component variable and possible to realize a model of an equivalent circuit for an electrical device including a coil reflecting the characteristics of the actual device.

In the equivalent circuit for a coil according to the present invention, preferably the current generator is a data base expressed with voltage or any other physical quantity as input and with a nonlinear electrical characteristic as output current. This data base can handle input of any physical quantity including the value of voltage. Due to this, it is possible to express any unspecified nonlinear electrical characteristic. Due to this, the inductance component able to be handled in the present invention can be applied without specifying the type of the nonlinear characteristic. As the any physical quantity, it is additionally possible to handle unspecified parameters such as typically the rotational information or temperature information of a motor, the operating state of other coils, past current-carrying states, etc.

In the equivalent circuit for a coil according to the present invention, preferably the equivalent circuit for a coil further includes a resistance component and induced voltage component. Due to this configuration, it becomes possible to calculate the induced voltage by explicitly expressing the induced voltage component as a term in addition to the inductance component. When using a current source to express the equivalent circuit for a coil, since the current source itself is not directly dependent on the voltage, this modelization enables the induced voltage in the no-load state to be found.

In the equivalent circuit for a coil according to the present invention, preferably the current generator makes the value of the current of the current source "0" when the voltage extractor detects an off state of the current based on the voltage across the terminals. Due to this configuration, when the current-carrying states of the drive currents to the coils of the different phases of a motor model are the non-current carrying states, the current generator can forcibly make the values of the currents of the current sources "0" and thereby stabilize the circuit operation.

In the equivalent circuit for a coil according to the present invention, when three coils are connected in a Y-configuration or delta configuration, the equivalent circuit is preferably provided with a current judger for judging the current-carrying states of the currents supplied to the three coils and a switch for making all of the switch elements of the three coils the on state when the current judger outputs off signals of current for all of the three coils. Due to this configuration, when evaluating the ability of the motor model as a generator, the current sources included in the inductance components of the coils of the different phases are separated from the circuit simulator. Due to this, when evaluating the ability of the coil as a generator, it has the function enabling extraction and evaluation of only the induced voltage component.

The circuit simulator according to the present invention is for analyzing an electrical device including a coil forming a magnetic circuit, where the electrical device is expressed by a motor model including three coils and where equivalent circuits for the three coils are comprised of inductance components. Each equivalent circuit of an inductance component is provided with a current source for outputting a current, a voltage extractor for extracting the voltage across terminals of the current source, a current generator for determining the value of the current of the current source based on the value of the voltage output by the voltage extractor, and a resistance element and switch element connected in parallel to the current source.

In the circuit simulator according to the present invention, preferably the current generator is a data base expressed with voltage or any other physical quantity as input and a nonlinear electrical characteristic as output current.

In the circuit simulator according to the present invention, preferably each equivalent circuit for a coil further includes a resistance component and induced voltage component.

In the circuit simulator according to the present invention, preferably the current simulator is provided with a current judger for judging the current-carrying states of the currents supplied to the three coils, and the current generator makes the values of the currents of the current sources "0" when the voltage extractors receive as input off signals of current output from the current judger.

In the circuit simulator according to the present invention, preferably the simulator is provided with a switching section for making all of the switch elements of the three coils the on-state when the current judger outputs off signals of current for all of the three coils.

In the circuit simulator according to the present invention, preferably the simulator is provided with a connection switch for making the connection structure of the three coils a Y-configuration or delta configuration.

Further, the storage medium of a circuit simulator program according to the present invention stores a program for making a computer realize the above-mentioned functions of the circuit simulator.

According to the present invention, when utilizing a commercially available circuit simulator to analyze an electrical device including a coil such as an electric motor, it is possible to handle a variable inductance component by an equivalent circuit for a coil forming a magnetic circuit. For this reason, it is possible to analyze an electrical device in the actual operating environment, iterative calculation becomes unnecessary when handling nonlinear characteristics, actual modelization can be realized using the value of the inductance device as a variable value, and a circuit simulator with an extremely high general applicability can be realized. In particular, when utilizing a commercially available circuit simulator for analyzing an electrical device, when preparing a model of an equivalent circuit of an electrical device including a coil forming a magnetic circuit and connecting it to the circuit simulator, if considering the actual device in preparation of the model of an equivalent circuit for the electrical device, the nonlinearity of the inductance component of a coil becomes an important element. This cannot be handled well by commercially available circuit simulators.

According to the present invention, there is provided a novel, useful model of an equivalent circuit as an equivalent circuit for a coil included in an electrical device for analysis by a commercially available circuit simulator. Due to this, the connectivity between the equivalent circuit of the electrical device and the commercially available circuit simulator is improved, the nonlinearity of the inductance component of a coil can be easily handled without changing the software of the commercially available circuit simulator itself and without nonlinear calculation, and the general applicability of the circuit simulator can be made extremely high.

Further, according to the present invention, when current-carrying states of the drive currents from the control circuit to the coils of the different phases of the motor model are the non-current carrying states, the circuit simulator detects these states and forcibly makes the current sources of the inductance components of the coils "0" so as to achieve stable circuit analysis. Further, when evaluating the performance as a generator, the current sources in the equivalent circuits for the coils are separated from the circuit to enable only the induced voltage components to be calculated. Further, when the motor model is comprised of three coils and the connection structure of the three coils can be switched to a Y-configuration or delta configuration, it is possible to set the values of the currents of the current sources for the coils of the different phases by a good accuracy in accordance with the connection structure.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, preferred embodiments of the present invention will be explained with reference to the attached drawings.

Figure 1:
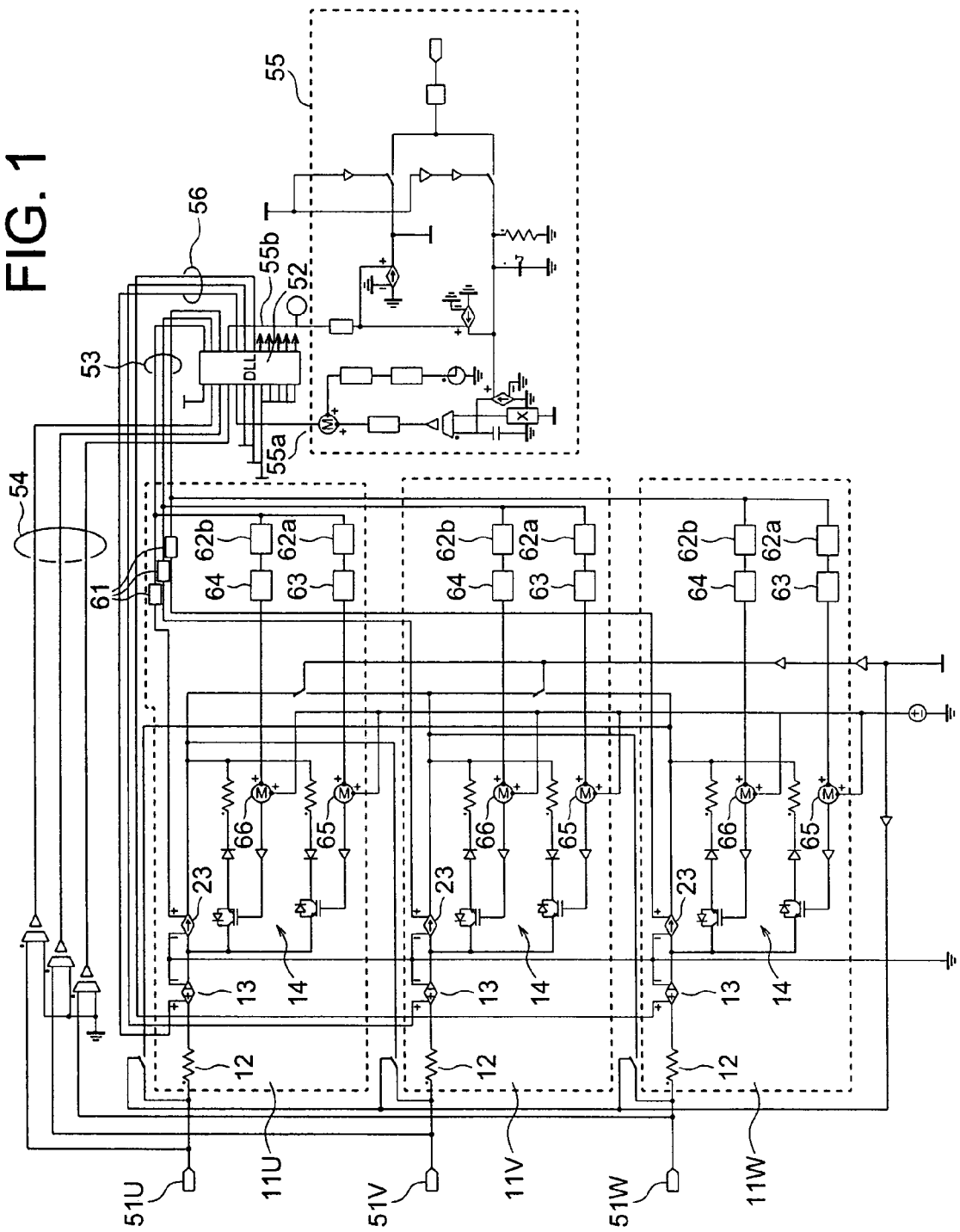
FIG. 1 is an equivalent circuit diagram of an electric motor in a circuit simulator according to an embodiment of the present invention.
Figure 2:
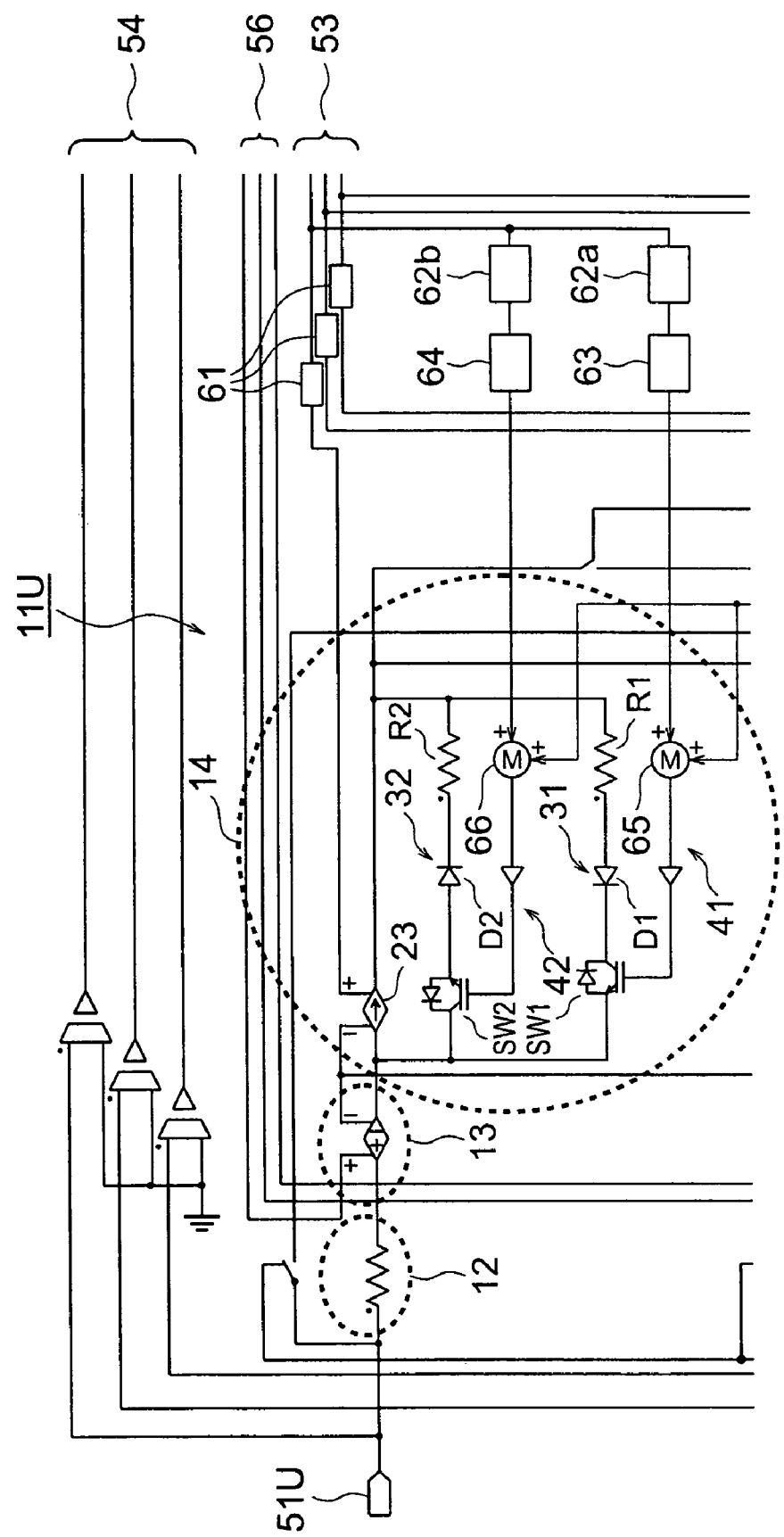
FIG. 2 is an enlarged view of the equivalent circuit at a U-phase coil part of the electric motor according to the above embodiment.
Figure 3:
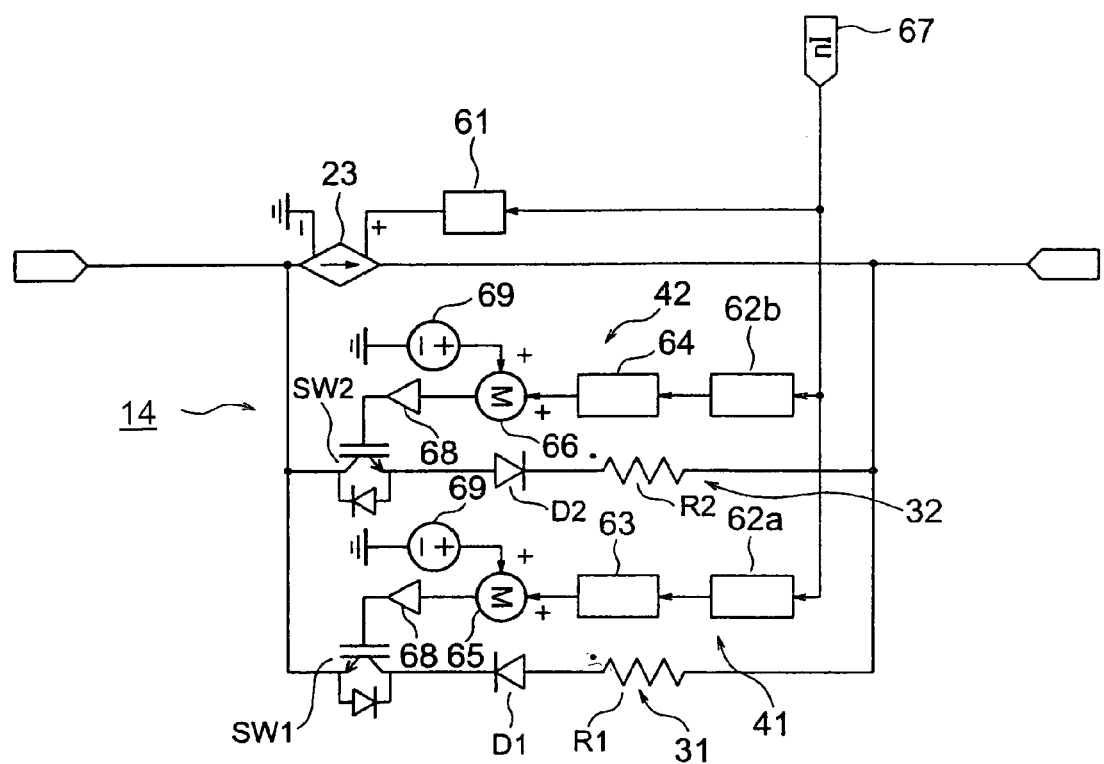
FIG. 3 is a circuit diagram of a detailed equivalent circuit of an inductance component of the coil.

Referring to FIG. 1 to FIG. 3, a basic embodiment of a circuit simulator for analysis according to the present invention will be explained. In this embodiment, the circuit simulator analyzes an electrical device including a coil forming a magnetic circuit. An electric motor will be explained as a typical example of such an electrical device. The equivalent circuit of the electric motor shown in FIG. 1 is configured so as to include an equivalent circuit of a coil of the present invention based on commercially available circuit simulator software as constituted by the above-mentioned "PSIM".

In the present embodiment, the electric motor is for example a three-phase synchronous motor. The three-phase synchronous motor has U-, V-, and W-phase coils connected for example by a Y-configuration. The different phase coils are supplied with on/off voltages having the sinusoidal characteristics of the phases forming the three-phase alternating current. The phases of the sinusoidal on/off voltages are offset by 120 degrees. Due to this, a rotating magnetic field is generated in the motor. A three-phase synchronous motor has a rotor formed by a magnet. This rotor rotates by the magnetic field of the magnet following the rotating magnetic field.

The equivalent circuit of the electric motor in the circuit simulator shown in FIG. 1 expresses the rotational behavior of the rotor of the three-phase synchronous motor. In the equivalent circuit diagram of the electric motor, the blocks 11U, 11V, and 11W express the U-, V-, and W-phase coils by equivalent circuits. The three coils 11U, 11V, and 11W are the same in the configurations of the equivalent circuits. Therefore, FIG. 2 shows enlarged only the U-phase coil 11U and the circuits related to this. Only the coil 11U will be explained as a typical example in accordance with FIG. 2.

In the circuit simulator according to the present embodiment, the equivalent circuit of the coil 11U of the electric motor, as shown in FIG. 2, is preferably comprised of a resistance component 12, an induced voltage component 13, and an inductance component 14. The example of expressing the configuration of the equivalent circuit of the coil 11U by the resistance component 12, induced voltage component 13, and inductance component 14 is a representative example. The present invention is not limited to this example of the configuration. That is, the equivalent circuit of the coil 11U requires the inductance component 14. However, the resistance component 12 and the induced voltage component 13 are not essential elements and can be changed in any way.

Here, referring to FIG. 4 to FIG. 11, the thinking behind expressing the equivalent circuit of the coil 11U in the above way will be explained.

Figure 4:
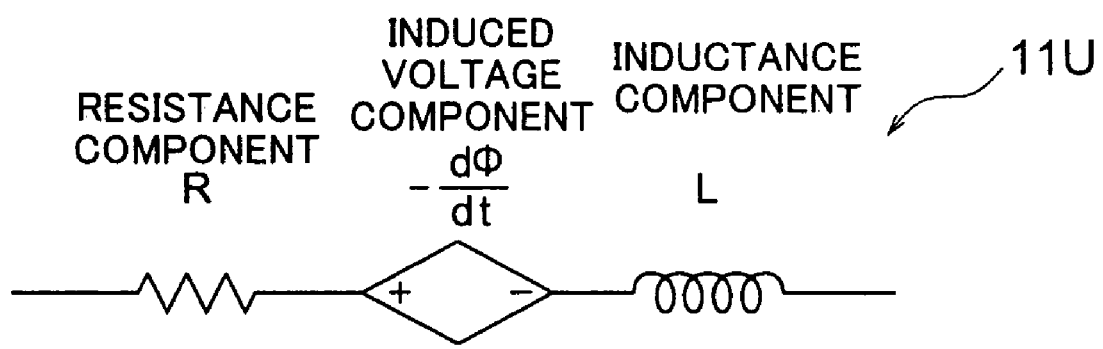
FIG. 4 is a view expressing the equivalent circuit for the coil.

In the circuit simulator according to the present invention embodiment, the model of the equivalent circuit of the coil 11U of the present embodiment can be conceptually shown like in FIG. 4. That is, the model of the equivalent circuit of the coil 11U is comprised of a resistance component (R), induced voltage component ($-d\Phi/dt$), and inductance component (L). The induced voltage component ($-d\Phi/dt$) considers the voltage generated due to changes in the linked magnetic flux given to the coil 11U from the outside. For example, in the case of an electric motor, at the time of rotation, the amount of flux received from the magnet's magnetic field changes, so an induced voltage is generated. Further, it is assumed that the inductance component (L) is not a fixed constant value, but a variable value. Between the model of the equivalent circuit of the coil 11U shown in FIG. 4 and the equivalent circuit of the coil 11U shown in FIG. 2, the resistance component (R) corresponds to the above resistance component 12, the induced voltage component ($-d\Phi/dt$) corresponds to the above induced voltage component 13, and the inductance component (L) corresponds to the above inductance component 14.

Note that as explained above, in the model of the equivalent circuit of the coil 11U, the inductance component (L) is essential from the viewpoint of the general applicability of the model of the equivalent circuit, but the resistance component (R) and the induced voltage component ($-d\Phi/dt$) are not essential. Therefore, the model of the equivalent circuit for a coil can be expressed by just the inductance component (L).

Figure 5:
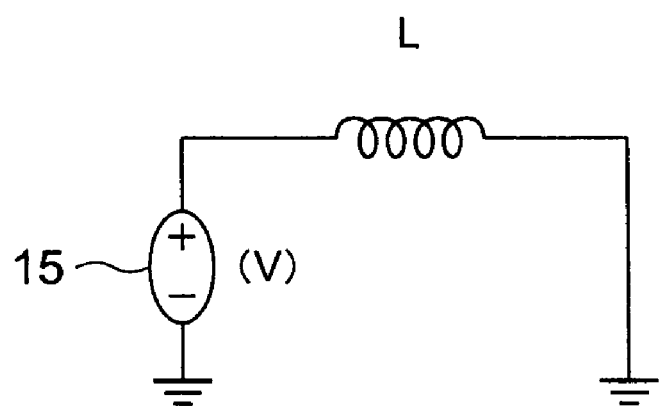
FIG. 5 is a view showing an inductance component of the coil.

Next, consider the inductance component (L) in the model of the equivalent circuit of the coil 11U. Look at the inductance component (L) by the relationship between the voltage and current. FIG. 5 shows the inductance component (L) to which a constant voltage (V) is applied from the constant voltage source 15. When the inductance component (L) is supplied with a constant voltage (V) by the constant voltage source 15, the current (I) flowing through the inductance component (L) is found as $I=(1/L)\int Vdt$. Here, the symbol "$\int$" is the symbol of an integration operation.

Figure 6:
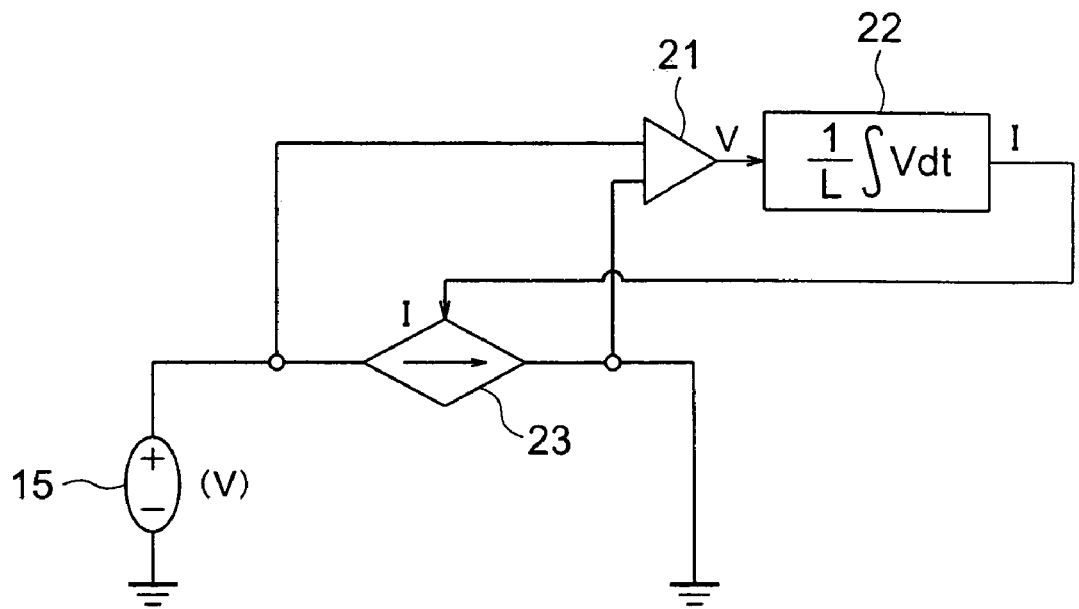
FIG. 6 is a view of an example of the equivalent circuit of the inductance component of the coil.

When expressing the inductance component (L) of the coil by a variable in commercially available circuit simulator software, for example, PSIM, the equivalent circuit becomes as shown in FIG. 6. The equivalent circuit of this inductance component (L) is expressed utilizing the current source (variable current source). That is, the equivalent circuit of the inductance component (L) is comprised of a voltage extractor (or voltage measuring device) 21 for fetching the voltage (V) constituted by the voltage across the terminals of the constant voltage source 15, a current generator 22 for determining and outputting the value of the current (I) based on the voltage (V) output from the voltage extractor 21, and a current source (variable current source) 23 determined by the value of the current (I) output from the current generator 22. The value of the voltage (V) input to the current generator 22 is given based on the value of the current (I) of the current source 23. Further, the value of the current (I) determined at the current generator 22 changes the value of the current of the current source 23.

The current generator 22 calculates and outputs the value of the current I for the input voltage value V based on the above equation "$I=(1/L)\int Vdt$". In actuality, the current generator 22 is provided as a data base in the circuit simulator and determines the value of the current for an input value of voltage V. Explaining the calculation routine at this circuit simulator, at a first step, the simulator calculates the voltage (V) based on the value of the current ($I_K$) of the current source 23 to find the voltage ($V_K$), at the second step determines the value of the current ($I_{K+1}$) based on the voltage ($V_K$), and repeats this. Therefore, the above current source 23 is configured as a variable current source.

However, if applying the equivalent circuit shown in FIG. 6 to the commercially available circuit simulator, the following problems arise.

Figure 7:
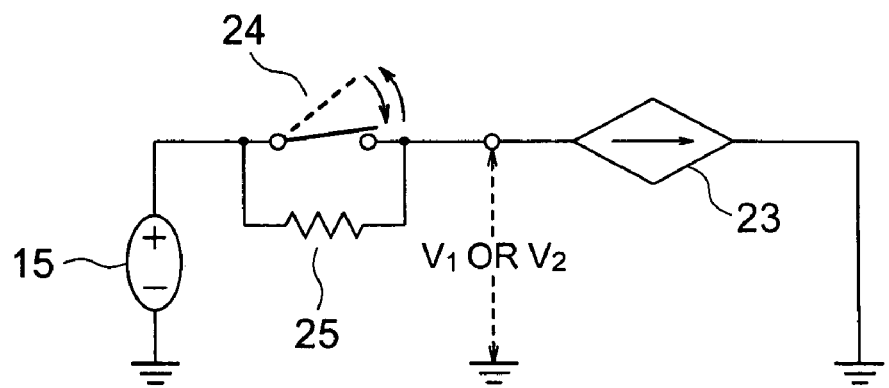
FIG. 7 is a view explaining problems in the equivalent circuit of the inductance component of the coil shown in FIG. 6.
Figure 8:
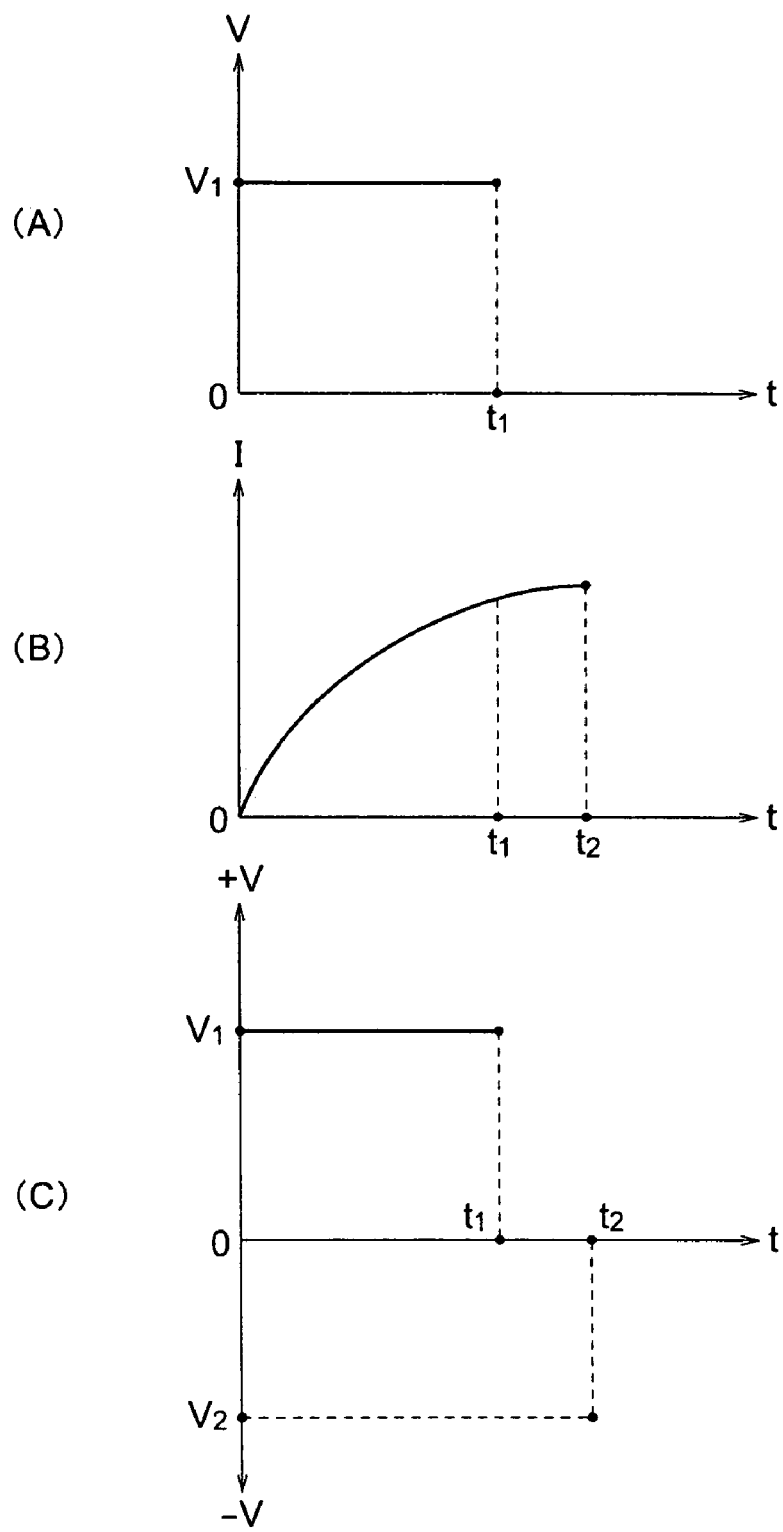
FIG. 8 is a view explaining problems relating to voltage in the equivalent circuit of the inductance component of the coil shown in FIG. 6.

The voltages supplied to the different phase coils in the electric motor (three-phase synchronous motor) according to the present embodiment are on/off voltages given from a three-phase bridge circuit in the motor drive circuit. Therefore, the inductance component of a coil (for example coil 11U) including the supplied on/off voltage may be expressed by an equivalent circuit for a coil such as shown in FIG. 7. FIG. 7 shows only the portions of the constant voltage source 15 and current source 23 in the equivalent circuit shown in FIG. 6. Between the constant voltage source 15 and the current source 23, an element comprised of the switch element 24 and a parallel resistor 25 (IGBT etc.) is connected in this configuration. The closed state shown by the solid line in the switch element 24 shows the on operation state, while the open state shown by the broken line shows the off operation state. When the coil (11U) is supplied with on voltage (when the switch element 24 performs an on operation) (voltage $V_1$ shown in FIG. 8(A)), the current flowing through the coil is calculated based on the above integration equation. Next, when the applied voltage of the coil (11U) becomes off (0) (when the switch element 24 performs an off operation, that is, the time $t_1$ shown in FIG. 8(A)), the current flowing to the coil (11U) continues as a large value continuing for any time based on the integration action (FIG. 8(B)) and a negative voltage of a relatively large value is generated by running a current through the parallel resistor 25 of the switch element 24 (voltage $V_2$ shown in FIG. 8(C)). Further, a time difference arises between the time ($t_1$) when the applied voltage of the coil (11U) becomes off and the time ($t_2$) when a negative voltage is generated. For this reason, at the next stage, the circuit simulator finds the value of the current of the current source 23 based on the negative voltage value ($V_2$). As a result, the phenomenon arises of the voltage (V) input to the current generator 22 greatly fluctuating. If such a fluctuating phenomenon arises, the calculation at the circuit simulator fails.

Figure 9:
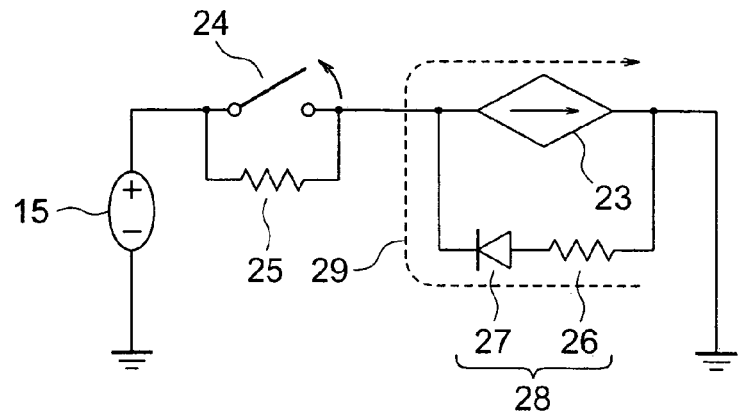
FIG. 9 is an equivalent circuit diagram of the inductance component of the U-phase coil of the electric motor for solving the problems explained in FIG. 8.

To solve the above problem arising due to making the inductance component of a coil in the commercially available circuit simulator variable, the equivalent circuit shown in FIG. 9 is proposed as a basic circuit. The equivalent circuit shown in FIG. 9 corresponds to the equivalent circuit shown in FIG. 7, the current source 23 has a suitably high resistance element 26 connected in parallel to it, and a diode 27 is added so as to prevent current carrying in the normal state. Since the current source 23 is provided with a single direction current-carrying path 28 in the opposite direction in parallel in this way, when the switch element 24 is turned off, it is possible to make the regenerative current based on the negative voltage flow as shown by the arrow 29 and prevent current from flowing to the above parallel resistor 25. Due to this, it is possible to eliminate the above fluctuation phenomenon arising due to the negative voltage arising when the switch element 24 is turned off.

Figure 10:
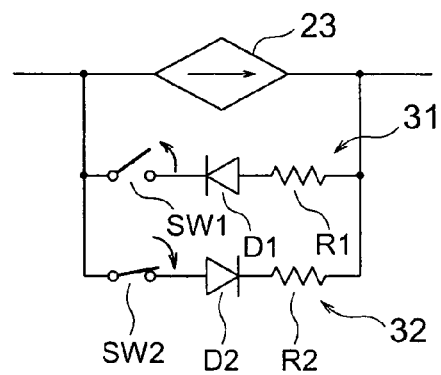
FIG. 10 is an equivalent circuit diagram for making the equivalent circuit of the inductance component shown in FIG. 9 more practical.

In the equivalent circuit of the part of the inductance component (L) of the coil 11U, since the part of the current source 23 has no directionality with respect to the inductance component itself, as shown in FIG. 10, considering directionality as well, in the end two one-directional current-carrying paths (31 and 32) comprised of the diodes D1 and D2 and the resistance elements R1 and R2 are connected in parallel. The current-carrying paths 31 and 32 respectively have switch elements SW1 and SW2 connected to them. These switch elements SW1 and SW2 are switched on/off in accordance with the current-carrying direction.

Figure 11:
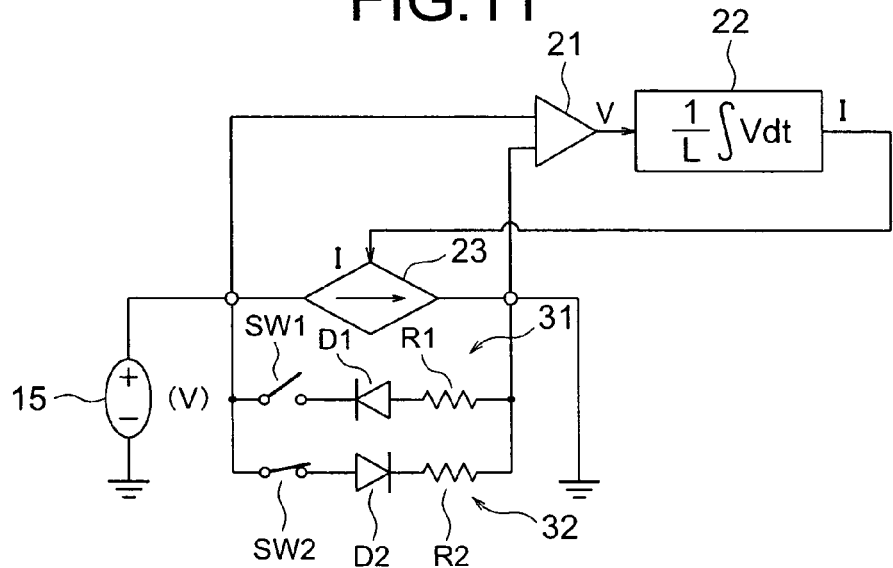
FIG. 11 is a view of an equivalent circuit of the inductance component of the coil according to the above embodiment.

Based on the above, the inductance component (L) according to the embodiment shown in FIG. 4 in the final analysis, as shown in FIG. 11, is comprised of the elements explained in FIG. 6, that is, the constant voltage source 15, voltage extractor 21, current generator 22, and current source 23 plus the above current-carrying paths 31 and 32 connected in parallel to the current source 23. Due to this, the circuit simulator realizes a model of an equivalent circuit for a coil including a variable inductance component.

Returning again to FIG. 1 to FIG. 3 for the following explanation, in FIG. 2, the inductance component 14 of the coil 11U is comprised of the current source 23 and the above-mentioned current-carrying paths 31 and 32. In the current-carrying paths 31 and 32, SW1 and SW2 are switch elements, D1 and D2 are diodes, and R1 and R2 are resistance elements. Further, the circuits 41 and 42 are electrical circuits for turning on/off the switch elements SW1 and SW2 of the current-carrying paths 31 and 32.

Referring to FIG. 1, the equivalent circuit of the electric motor as a whole will be explained. The above-mentioned coil 11U is provided in parallel with the V-phase and W-phase coils 11V and 11W having circuit configurations the same as the coil 11U. The three terminals 51U, 51V, and 51W are power terminals for supplying on/off voltage (V) for excitation use to the coils 11U, 11V, and 11W.

The circuit element 52 shown by the block DLL conceptually shows an external program. Below, this will be described as the "external program 52". This external program 52 corresponds to the above-mentioned current generator 22 and functions as a "data base" for giving to the current sources 23 of the inductance components 14 of the coils 11U, 11V, and 11W values of currents (I) corresponding to the voltages (V) applied by the output signal line group 53. Further, the external program 52 also has the function of giving the above-mentioned induced voltage component 13 by the output signal line group 56. Further, as input signals of the external program 52, the external program 52 receives as input from the input signal line group 54 signals according to the applied voltages from the above terminals 51U, 51V, and 51W. Further, torque information is input from the external program 52 through the signal line 55b to the block 55, the circuit of the block 55 solves a motion equation to find the angular information, and this angular information is input through the signal line 55a to the external program 52.

Signals according to the values of the current (I) given by the signal lines of the above output signal line group 53 to the current sources 23 of the coils 11U, 11V, and 11W are given through a signal converter 61, branched midway, and passed through signal discriminators 62a and 62b and filters 63 and 64 to the adders 65 and 66 of the above-mentioned circuits 41 and 42. This circuit portion is shown in the same way in FIG. 2.

The configuration of the above circuit portion will be explained in more detail with reference to FIG. 3. FIG. 3 shows the detailed equivalent circuit of the inductance component 14 of the U-phase coil 11U. In the inductance component 14 of the coil 11U shown in FIG. 3, the current source 23 has the above-mentioned one-directional current-carrying paths 31 and 32 connected in parallel with it. The current-carrying path 31 is formed by a serial circuit of a switch element SW1, diode D1, and resistance element R1, while the current-carrying path 32 is formed by a serial circuit of a switch element SW2, diode D2, and resistance element R2. The current-carrying path 31 is further provided with the above circuit 41 for controlling the on/off operation of the switch element SW1, while the current-carrying path 32 is further provided with the above circuit 42 for controlling the on/off operation of the switch element SW2.

The port 67 is an input port to which the U-phase output signal line included in the output signal line group 53 from the data base, that is, the external program 52, is connected. Therefore, the port 67 receives as input a signal according to the value of the current (I) in accordance with the voltage (V) applied through the terminal 51U to the U-phase coil 11U. The signal according to the value of the current (I) input to the port 67 is supplied to the signal converter 61 and is supplied through the signal discriminators 62a and 62b and the filters 63 and 64 to the adders 65 and 66 of the circuits 41 and 42.

The signal converter 61 converts the signal based on an input signal according to the value of the current (I) and outputs a signal designating the value of the current (I) to the current source 23. The current source 23 determines the value of the current (I) output based on the signal output from the signal converter 61. In this way, the current source 23 determines the value of the current based on the signal given from a data base, that is, the external program 52. Due to this, the inductance component 14 of the U-phase coil 11U expressed as an equivalent circuit utilizing the current source 23 is made variable in accordance with the rotor and value of the current etc. of the motor.

However, as explained above, to prevent failure in calculation in the circuit simulator, the current-carrying paths 31 and 32 are provided to prevent the above fluctuation phenomenon. Further, the circuits 41 and 42 are provided for controlling the on/off operations of the switch elements SW1 and SW2 of the current-carrying paths 31 and 32 in accordance with the current-carrying direction. The circuits 41 and 42 are formed by the above adders 65 and 66 and diode 68.

The signal discriminators 62a and 62b supplied with signals according to the value of the current (I) discriminate the signs of the signals according to the value of the current (I) and discriminate the current-carrying direction of the current. The signal discriminators 62a and 62b discriminate the signs of the signals relating to the value of the current (I), then one of the signal discriminators 62a and 62b outputs a discrimination signal. Signals output from the signal discriminator 62a and 62b are multiplied with coefficients for sign conversion (+1 or −1) set in the next filters 63 and 64, then input to the adders 65 and 66 of the circuits 41 and 42. In the adders 65 and 66, the values of the voltage signals output from the filters 63 and 64 are added with the value of the output voltage from an offset voltage source 69 for outputting for example 1V voltage. Voltages output from the adders 65 and 66 are input to an ON/OFF conversion device 68. Further, the signal output from the ON/OFF conversion device 68 is given to the bases (gates) of the switch elements SW1 and SW2 to control the on/off operations of the switch elements SW1 and SW2. In the on/off operations of the switch elements SW1 and SW2, when either is on, the other is controlled to be off. Due to this, the above-mentioned regenerative current is generated. Note that the configurations of the circuits 41 and 42 are not limited to the illustrated configurations. The functions of the circuits 41 and 42 are functions of switching the switch elements SW1 and SW2 on/off while viewing the current-carrying directions of the input currents to the current sources 23. The circuits 41 and 42 employed may be of any configurations so long as the circuits have the above functions.

Based on the above, when connecting to a commercially available representative circuit simulator (PSIM) an electric motor (three-phase synchronous motor) having coils with variable inductance components, the model of the equivalent circuit of the electric motor according to the present embodiment is created based on the models of the coils of the different phases shown in FIG. 4, in particular, is created making the inductance components (L) the equivalent circuits shown in FIG. 11. By configuring the model of the equivalent circuit of the electric motor in the above way, even if making the inductance components of the different phases of the coils variable, it is possible to utilize a commercially available circuit simulator for motor analysis without problem.

Figure 12:
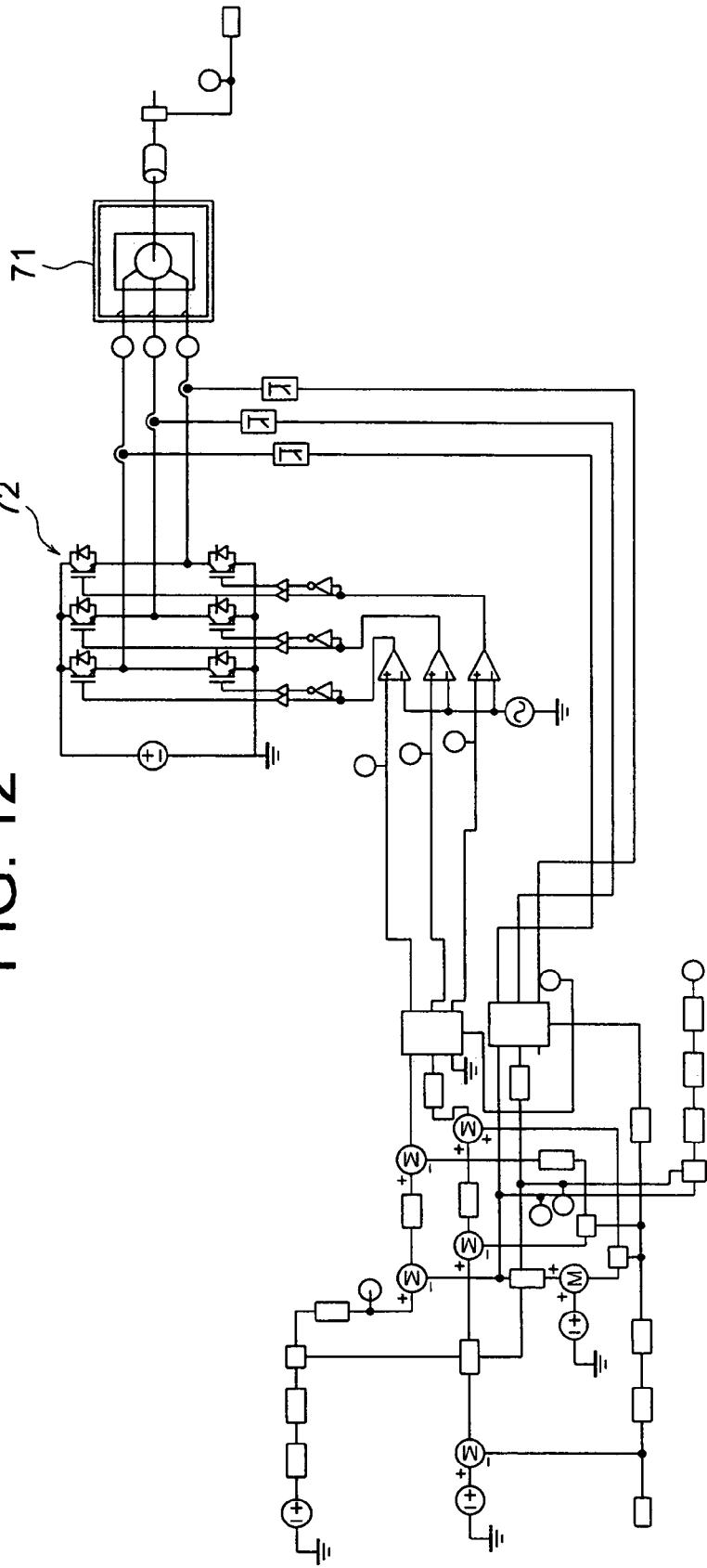
FIG. 12 is a circuit diagram showing the overall configuration of the circuit simulator according to an embodiment of the present invention.

FIG. 12 shows the equivalent circuit presented to the user by a commercially available circuit simulator (PSIM). The user sets the usage environment in the equivalent circuit of FIG. 12 displayed on the screen of the display device. In the circuit simulator shown in FIG. 12, 71 indicates the equivalent circuit of the motor portion. The equivalent circuit 71 of this motor is comprised of the circuit shown in FIG. 1. Note that in the circuit simulator of FIG. 12, the circuit 72 is a bridge circuit supplying the motor 71 with on/off voltages of the different phases for driving the motor.

Figure 13:
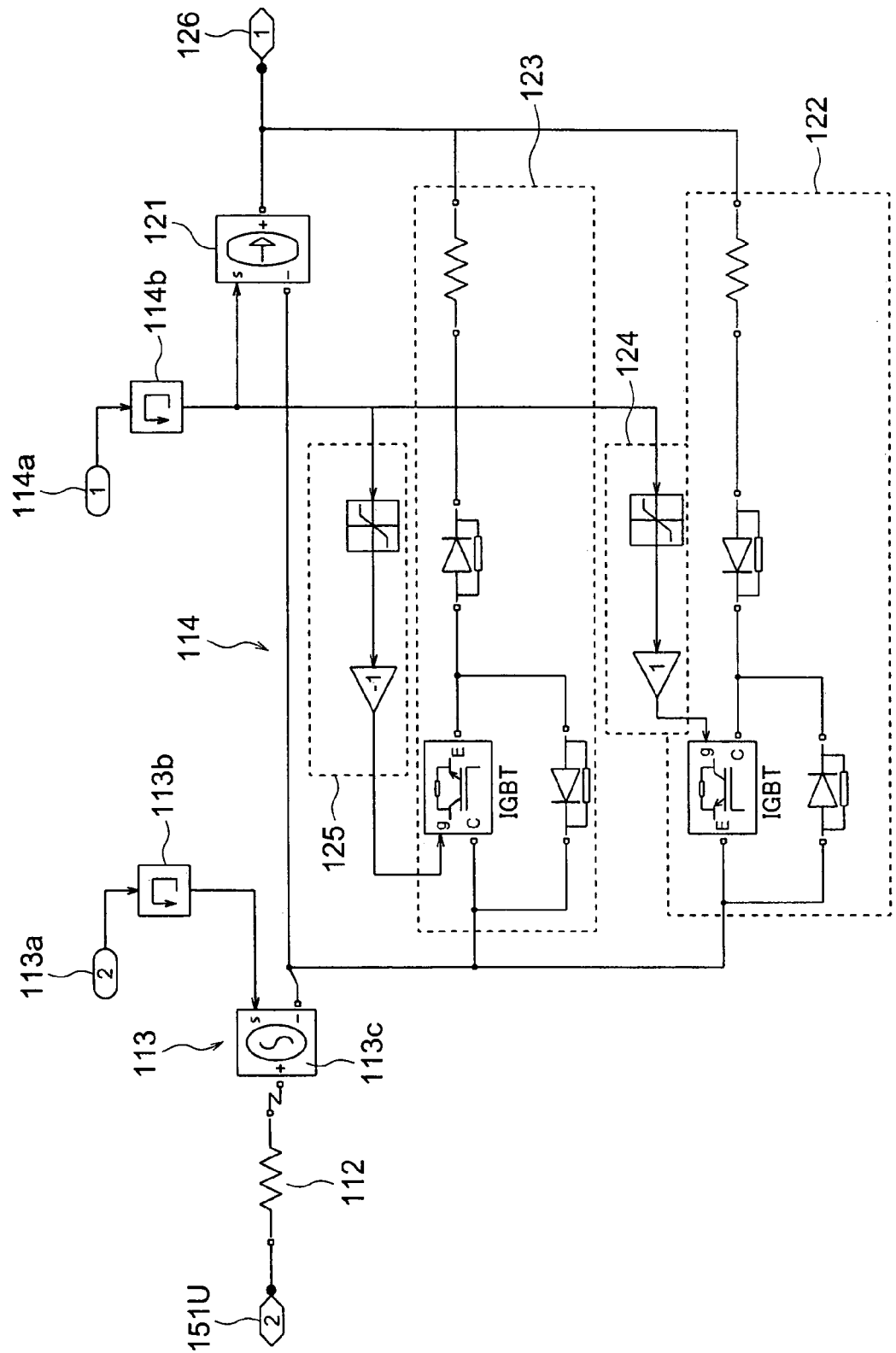
FIG. 13 is an equivalent circuit diagram showing a coil of another embodiment of the present invention.

Next, FIG. 13 shows another embodiment of a circuit simulator according to the present invention. This circuit simulator was prepared based on the commercially available software "Simulink®".

FIG. 13 shows a model of the equivalent circuits of the coils of the different phases. In FIG. 13, 151U indicates a terminal, 112 indicates a resistance component, 113 indicates an induced voltage component, and 114 indicates an inductance component. These terminal 151U, resistance component 112, induced voltage component 113, and inductance component 114 correspond to the terminal 51U, resistance component 12, induced voltage component 13, and inductance component 14 explained in the above embodiment. In the induced voltage component 113, data relating to the induced voltage is given through a port 113a. The data relating to the induced voltage is stored in a memory 113b, then is given to a variable voltage source 113c. In the inductance component 114, data relating to the value of the current is given through a port 114a and stored in a memory 114b. The above memories 113b and 114b are time delay elements for transmitting nonlinear information of the circuit simulator and coil model. In the inductance component 114, 121 corresponds to the current source 23, the blocks 122 and 123 correspond to the current-carrying paths 31 and 32, and the blocks 124 and 125 correspond to the circuits 41 and 42 The function of the current source 121 is the same as the function of the current source 23, the functions of the current-carrying paths 122 and 123 are the same as the functions of the current-carrying paths 31 and 32, and the functions of the circuits 124 and 125 are the same as the functions of the circuits 41 and 42, so detailed explanations will be omitted. Note that a port 126 is a port connected to a higher electrical circuit.

Even when connecting an electric motor having coils with variable inductance components (three-phase synchronous motor) to the commercially available circuit simulator (Simulink®), in the same way as the case of the above-mentioned embodiment, even when making the inductance components of the different phase coils variable, it is possible to utilize a commercially available circuit simulator to analyze the motor without problem.

Next, still another embodiment of a circuit simulator for analysis according to the present invention will be explained with reference to FIG. 14 and FIG. 15. In the explanation of this embodiment, elements substantially the same as elements explained in the above-mentioned embodiments are assigned the same reference numerals.

Figure 14:
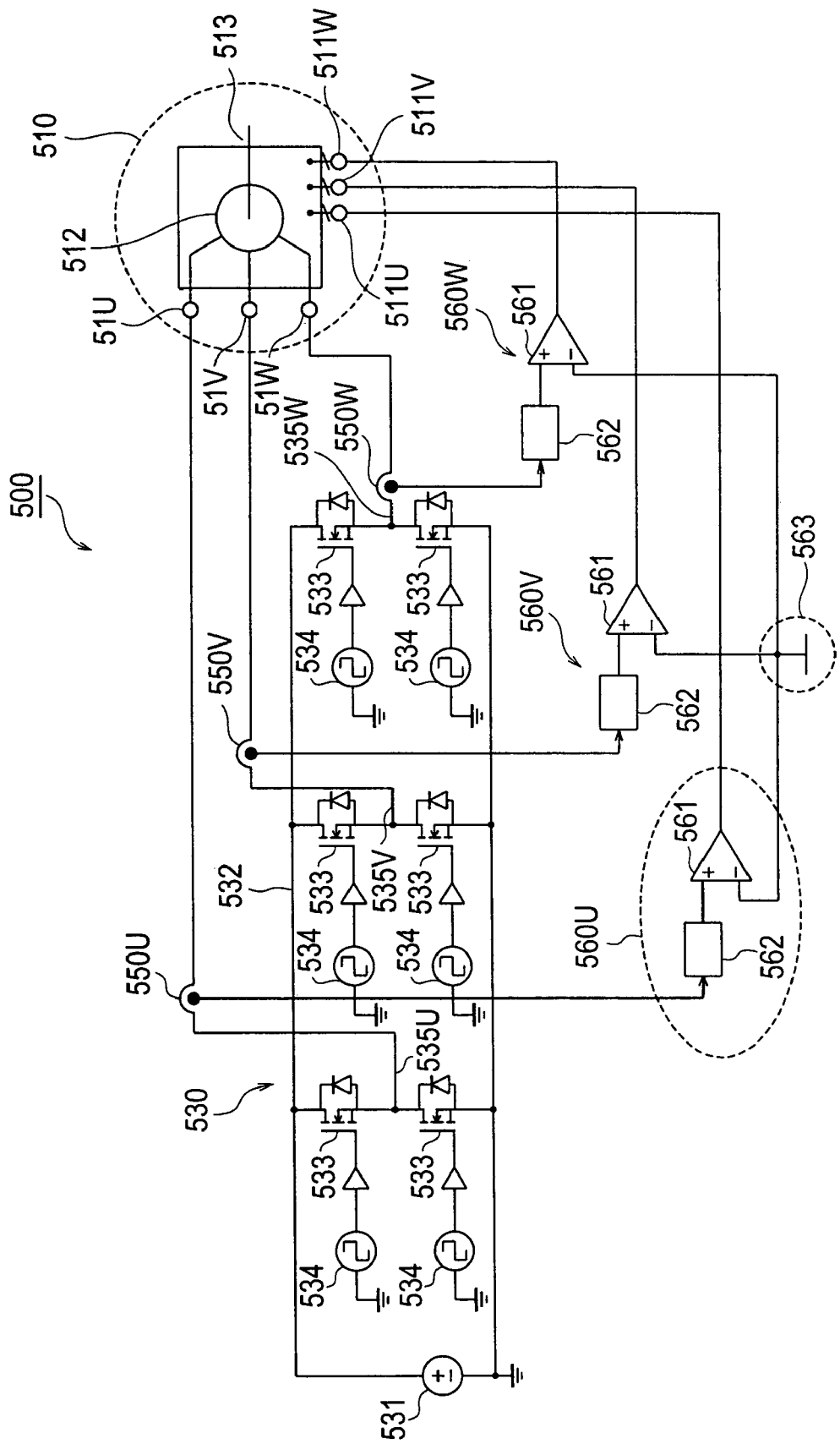
FIG. 14 is an equivalent circuit diagram showing the overall configuration of the circuit simulator according to an embodiment of the present invention.

FIG. 14 shows the equivalent circuit of the circuit simulator as a whole. FIG. 15 shows the equivalent circuit of an electric motor model (or generator model) included in the circuit simulator shown in FIG. 14. FIG. 15 is a view similar to the above-mentioned FIG. 1.

The electrical device according to this embodiment is an electric motor or generator. An electric motor and a generator are basically the same in circuit configuration. The relative magnitude of the power supplied from the outside compared with the power generated at the coil side determines whether the circuit is an electric motor or generator.

The electric motor of the present embodiment, like in the above-mentioned embodiment, is a three-phase synchronous motor. The three-phase synchronous motor has U-, V-, and W-phase coils connected by a Y-configuration (star configuration) or delta configuration. In the circuit simulator of this embodiment, it is possible to select the Y-configuration or delta configuration in accordance with the analysis conditions.

The different phase coils of the electric motor are supplied with on/off voltages having sinusoidal characteristics of the phases forming the three-phase alternating current. By making the phases of the sinusoidal on/off voltages offset by 120 degrees, a rotating magnetic field is generated in the motor. A three-phase synchronous motor has a rotor formed by a magnet. This rotor rotates by the magnetic field due to this magnet following the rotating magnetic field.

The circuit simulator 500 shown in FIG. 14 is comprised of a motor model 510, a control circuit 530, current detectors 550U, 550V, and 550W, and current value judgers 560U, 560V, and 560W.

The circuit simulator 500 is prepared by the user using commercially available circuit simulator software. The part which the user of the circuit simulator 500 mainly prepares is the control circuit 530. The motor model 510 is provided as the part having the characterizing configuration of this embodiment. The current detectors 550U, 550V, and 550W and the current value judgers 560U, 560V, and 560W, in relation to the characterizing configuration of the motor model 510, detect the current-carrying states (values of the currents) of the different phases of the three-phase alternating current for driving the motor supplied from the control circuit 530 to the motor model 510, judge the presence of the detected values of the currents for the different phase, and supply judgment signals to the motor model 510.

The motor model 510 is the part showing the model of the above three-phase synchronous motor. The motor model 510 has three terminals 51U, 51V, and 51W for input of the three-phase alternating current for driving the motor supplied from the control circuit 530 and three terminals 511U, 511V, and 511W for input of judgment signals relating to the current-carrying states of the different phases output from the current value judgers 560U, 560V, and 560W. In the motor model 510, the part 512 is a motor, while the part 513 is a shaft.

The control circuit 530 is configured as a control circuit for pulse amplitude modulation (PAM) drive generating a three-phase alternating current. The control circuit 530 is comprised of a direct current power source 531 and a three-phase alternating current inverter circuit 532. The three-phase alternating current inverter circuit 532 is formed as a bridge circuit using six switch elements 533 such as power use MOS type transistors. In the three-phase alternating current inverter circuit 532, the gates of the six switch elements 533 receive as input on/off signals of the required level at suitable timings based on the corresponding on/off signal generators 534. Due to this, the pulse amplitude modulated U-phase current, V-phase current, and W-phase current are output from the U-phase output terminal 535U, V-phase output terminal 535V, and W-phase output terminal 535W of the inverter circuit 532.

Between the control circuit 530 and the motor model 510, the U-phase output terminal 535U is connected to the terminal 51U, the V-phase output terminal 535V is connected to the terminal 51V, and the W-phase output terminal 535W is connected to the terminal 51W. Due to this, the U-phase current, V-phase current, and W-phase current for exciting and driving the pulse amplitude modulated motor output from the U-phase output terminal 535U, V-phase output terminal 535V, and W-phase output terminal 535W in the control circuit 530 are supplied to the motor model 510. In this way, the motor model 510 is PAM driven by the control circuit 530.

In the above, the above current detector 550U is provided on the output line of the U-phase output terminal 535U in the control circuit 530, the current detector 550V is provided on the output line of the V-phase output terminal 535V, and the current detector 550W is provided on the output line of the V-phase output terminal 535V.

Each of the above current value judgers 560U, 560V, and 560W is comprised of one comparison circuit 561 and one absolute value circuit 562. One input terminal (+terminal) of the comparison circuit 561 receives as input the current detection signal output from the corresponding one of the current detectors 550U, 550V, and 550W after being converted to absolute value at the absolute value circuit 562. The other input terminal (−terminal) of the comparison circuit 561 receives as input a current threshold value signal given from a current threshold value supply unit 563. The current value judgers 560U, 560V, and 560W compare the current detection values and current threshold value, deem a very small value of the current to be "0" for the current-carrying states of the different phases when the current detection values become the current threshold value or less, and supply off signals of current as the above judgment signals to the terminals 511U, 511V, and 511W of the motor model 510. Here, the above "very small value of the current" is for example a value of about $1/10^4$ to $1/10^5$ compared with the value of the current to be detected and means a value of the current sufficiently small compared with the value of the current covered by calculation by the circuit simulation.

Next, referring to FIG. 15, the equivalent circuit of the electric motor in the circuit simulator 500, that is, the above motor model 510, will be explained. The equivalent circuit of the electric motor shown in FIG. 15 expresses the rotational behavior of the rotor in the above-mentioned three-phase synchronous motor.

Figure 15:
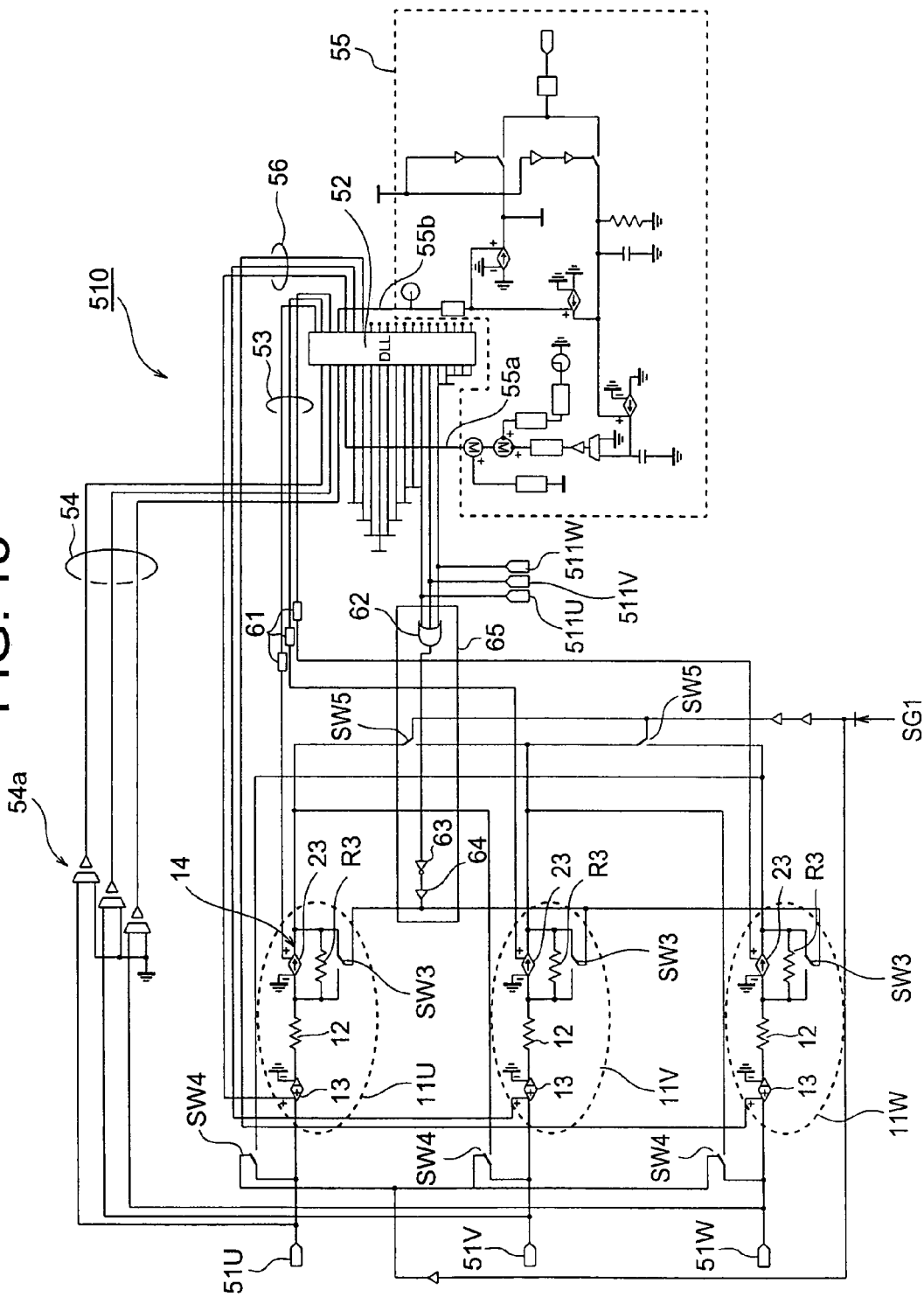
FIG. 15 is an equivalent circuit diagram showing the detailed circuit configuration of the motor model of the circuit simulator according to the other embodiment.

In FIG. 15, the blocks 11U, 11V, and 11W express the coils of the U-, V-, and W-phases by equivalent circuits. The three coils 11U, 11V, and 11W are the same in the configurations of the equivalent circuits. Therefore, FIG. 16 shows enlarged only the U-phase coil 11U and the circuits related to this and explains only the coil 11U as a typical case.

Figure 16:
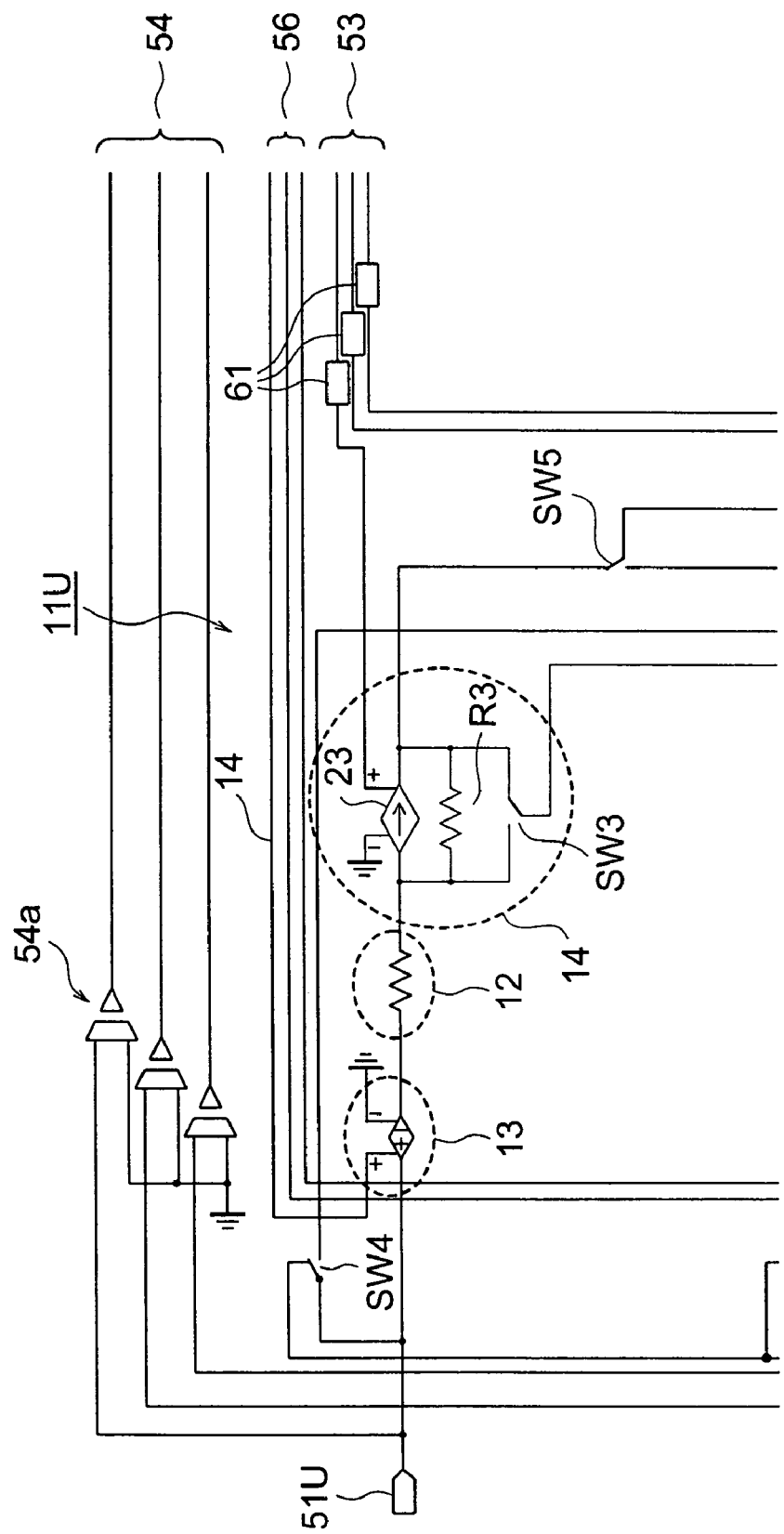
FIG. 16 is an enlarged view of the equivalent circuit of the U-phase coil part in the motor model according to the other embodiment.

In the circuit simulator according to the present embodiment, the equivalent circuit of the coil 11U of the electric motor 1, as shown in FIG. 16, like in the above-mentioned embodiments, is comprised of a resistance component 12, induced voltage component 13, and inductance component 14.

The example of expressing the configuration of the equivalent circuit of the coil 11U by the resistance component 12, induced voltage component 13, and inductance component 14 is a representative example. The invention is not limited to this. That is, in the case of an electric motor model, in the equivalent circuit of the coil 11U, the inductance component 14 is essential, but the resistance component 12 and the induced voltage component 13 are not essential elements and can be changed in anyway. On the other hand, when treated as a generator model, the induced voltage component 13 is essential. Conversely, when desiring to extract and evaluate only the magnitude of the induced voltage, to improve the stability of the circuit simulation, the inductance component 14 has to be separated as an element constituting the electrical circuit.

Figure 17:
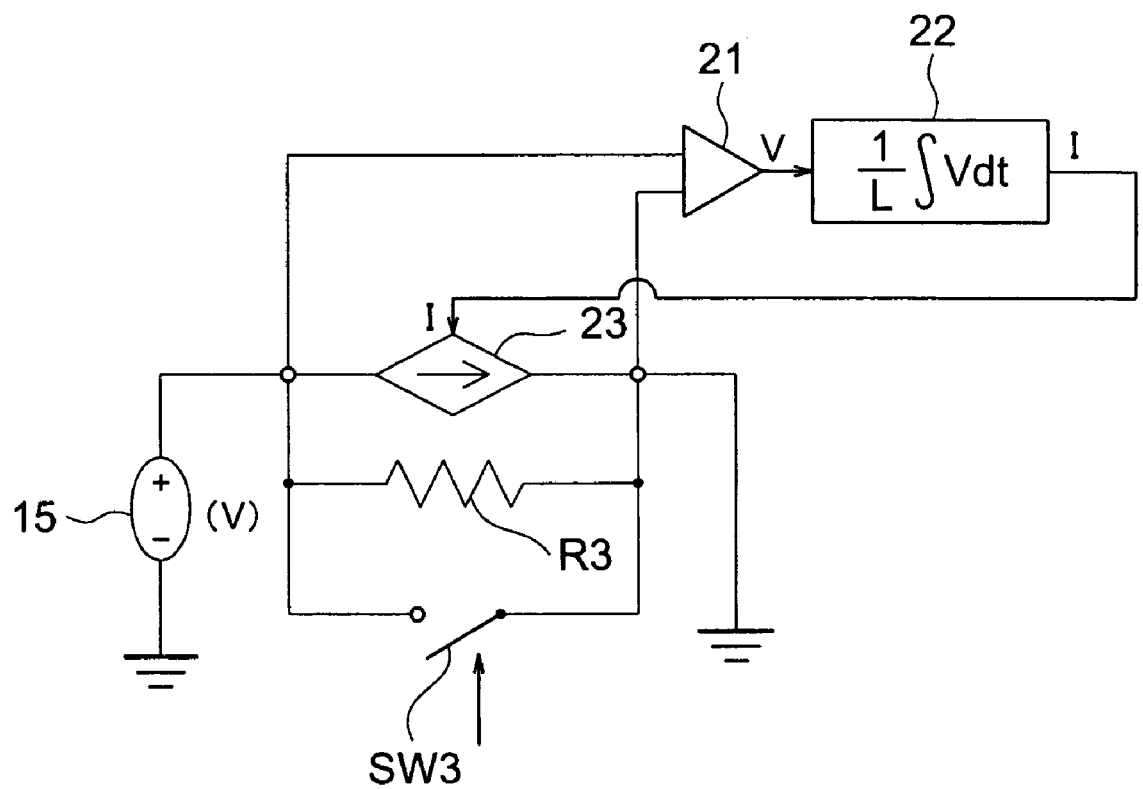
FIG. 17 is a view of an equivalent circuit of the inductance component of the coil according to the other embodiment.

Note that while the equivalent circuit of the coil 11U was explained expressed with reference to FIG. 4 to FIG. 11 in the above-mentioned embodiment, the equivalent circuit of the coil 11U according to this embodiment is in the final analysis expressed by the circuit as shown in FIG. 17.

As explained above, the inductance component (L) shown in FIG. 4 ideally is comprised, as shown in FIG. 11, of the elements explained in FIG. 6, that is, the constant voltage source 15, voltage extractor 21, current generator 22, and current source 23 plus the above current-carrying paths 31 and 32 connected in parallel to the current source 23. By this circuit configuration, the current (regenerative current 29 etc.) flowing when the current source 23 of the coil has resistors (R1 and R2) of large resistance values corresponding to the current-carrying directions connected to it in parallel and the current from the constant voltage source 15 is off, that is, at the time of the non-current carrying state, is attenuated.

However, in the expression of the motor model 510 in an actual circuit simulator 500, streamlining of the circuit configuration and practicality are demanded. Therefore, in the present embodiment, from the viewpoint of streamlining the circuit configuration and the viewpoint of practicality, the equivalent circuit of the inductance component (L) shown in FIG. 11 can also be used in the equivalent circuit as shown in FIG. 17. In the equivalent circuit of the inductance component (L) shown in FIG. 17, the current source 23 has a resistance element R3 of the required magnitude connected to it in parallel. Due to this configuration, the current flowing at the time of the non-current carrying state is passed through the resistance element R3 to generate the above-mentioned attenuation state and the value of the current of the current source 23 is made "0".

Further, in the equivalent circuit of the inductance component (L) shown in FIG. 17, the current source 23 and resistance element R3 have a switch element SW3 connected to them in parallel. This switch element SW3 is turned on/off based on the later explained conditions. When the switch element SW3 is in the off state, the above current source 23 in the coil is treated as valid in the equivalent circuit of the motor model 510. Contrary to this, when the switch element SW is in the on state, the current source 23 in the coil is treated as invalid in the equivalent circuit of the motor model 510. That is, when the non-current carrying states occur at the three coils (11U, 11V, and 11W) (when the current from the external constant voltage source 15 is in the off state), the switch element SW3 is set to the on state so as to separate the current sources 23 from the circuit simulator.

Returning again to FIG. 15 and FIG. 16 for the explanation, in FIG. 15, the inductance component 14 of the coil 11U is comprised of a current source 23, resistance element R3, and switch element SW3. The equivalent circuits of the other coils 11V and 11W are also comprised of resistance components 12 and induced voltage components 13 and the above inductance components 14.

The overall configuration of the motor model 510 will be explained with reference to FIG. 15. The coil 11U is provided in parallel with V-phase and W-phase coils 11V and 11W having the same circuit configuration as the coil 11U. The three terminals 51U, 51V, and 51W are, as explained above, power terminals for supplying the coils 11U, 11V, and 11W with the excitation on/off voltage (V) from the external control circuit 530.

The circuit element 52 shown by the block DLL, as explained above, is an external program 52. The external program 52 corresponds to the above-mentioned current generator 22 and is a circuit element functioning as a "nonlinear data base" for giving a value of the current (I) in accordance with the voltage (V) etc. applied to the current sources 23 of the inductance components 14 of the coils 11U, 11V, and 11W by the output signal line group 53. Further, the external program 52 has the function of giving the value of the above-mentioned induced voltage component 13 by the output signal line group 56. Further, as the input signals of the external program 52, the external program 52 receives as input the signals relating to the applied voltage from the above terminals 51U, 51V, and 51W by the input signal line group 54. The location 54a in the input signal line group 54 is the location for extracting the voltage across terminals at the connections. Further, torque information is input from the external program 52 through the signal line 55b to the block 55, the circuit of the block 55 solves a motion equation to find the angular information, and this angular information is input through the signal line 55a to the external program 52.

Signals according to the values of the currents (I) given by the signal lines of the above output signal line group 53 to the current sources 23 of the coils 11U, 11V, and 11W are given through the signal converter 61.

The signal converter 61 converts signals based on signals according to the input values of the currents (I) and outputs to the current sources 23 signals designating the values of the currents (I). The current sources 23 determine the values of the currents (I) output based on the signals output from the signal converter 61. In this way, the current sources 23 determine the values of the currents based on signals given from the data base, that is, the external program 52. Due to this, the inductance component 14 of for example the U-phase coil 11U expressed by an equivalent circuit utilizing such a current source 23 is made variable in accordance with the rotor, value of the current, etc. of the electric motor.

The three terminals 511U, 511V, and 511W of the motor model 510 are supplied with off signals of current from the current value judgers 560U, 560V, and 560W when the current detection values become a current threshold value or less. Therefore, the signals input to the three terminals 511U, 511V, and 511W can be used to detect the current-carrying states of the U-phase, V-phase, and W-phase.

The signals input to the three terminals 511U, 511V, and 511W are input to the external program 52. The external program 52, as explained above, makes the values of the currents of the current sources 23 in the inductance components 14 of the corresponding phase coils 11U, 11V, and 11W strictly "0" when the terminals 511U, 511V, and 511W receive as input off signals of current.

Further, the signals input to the three terminals 511U, 511V, and 511W are input to the OR gate 62. The output signal of the OR gate 62 is inverted in state at a NOT circuit 63, is amplified to the required level at the amplifier 64, and is supplied to the switch elements SW3 of the inductance components 14 of the three coils 11U, 11V, and 11W. The output signal of the OR gate 62 determines the on/off states of the switch elements SW3 of the inductance components 14 of the coils 11U, 11V, and 11W. When any of the signals input to the terminals 511U, 511V, and 511W is not the off signal of current (0), the output of the NOT circuit 63 becomes 0, and all of the switch elements SW3 of the coils 11U, 11V, and 11W are held in the off state. When all of the signals input to the terminals 511U, 511V, and 511W are off signals of current (0), the output of the NOT circuit 63 becomes "1" and all of the switch elements SW3 of the coils 11U, 11V, and 11W are switched to the on state. When all of the switch elements SW3 of the inductance components 14 of the coils 11U, 11V, and 11W become the on state, the current sources 23 of the inductance components 14 of the coils 11U, 11V, and 11W are separated from the motor model 510. This means that the motor model 510 is used not for the usual evaluation of the drive performance of the electrical device, but for evaluation of the induced voltage of the generator. By separation of the current sources 23 of the inductance components 14, the motor model 510 enters the mode for calculation of the induced voltage.

In the above sense, the circuit 65 comprised of the OR gate 62, NOT circuit 63, and amplifier 64 functions as a unit for setting the power generating state.

Further, in the motor model 510, three switch elements SW4 and two switch elements SW5 are provided for determining the connections in relation to the three coils 11U, 11V, and 11W. The on/off states of these three switch elements SW4 and two switch elements SW5 are determined by a signal SG1 supplied from the outside. Since the NOT circuit 66 is provided, the on/off states of the three switch elements SW4 and the two switch elements SW5 become opposite from each other. When the SG1 is "0", the three switch elements SW4 become the off state, while the two switch elements SW5 become the on state. In this case, the connection structure of the three coils 11U, 11V, and 11W becomes a Y-configuration (star configuration). When the SG1 is "1", the three switch elements SW4 become the on state, while the two switch elements SW5 become the off state. In this case, the connection structure of the three coils 11U, 11V, and 11W becomes a delta configuration. In this way, according to the signal SG1, the connection structure of the three coils 11U, 11V, and 11W can be switched to the Y-configuration or delta configuration.

Next, the overall operation and characterizing operation of the circuit simulator 500 and motor model 510 having the above circuit configuration will be explained with reference to the flow charts of FIG. 18 and FIG. 19.

Figure 18:
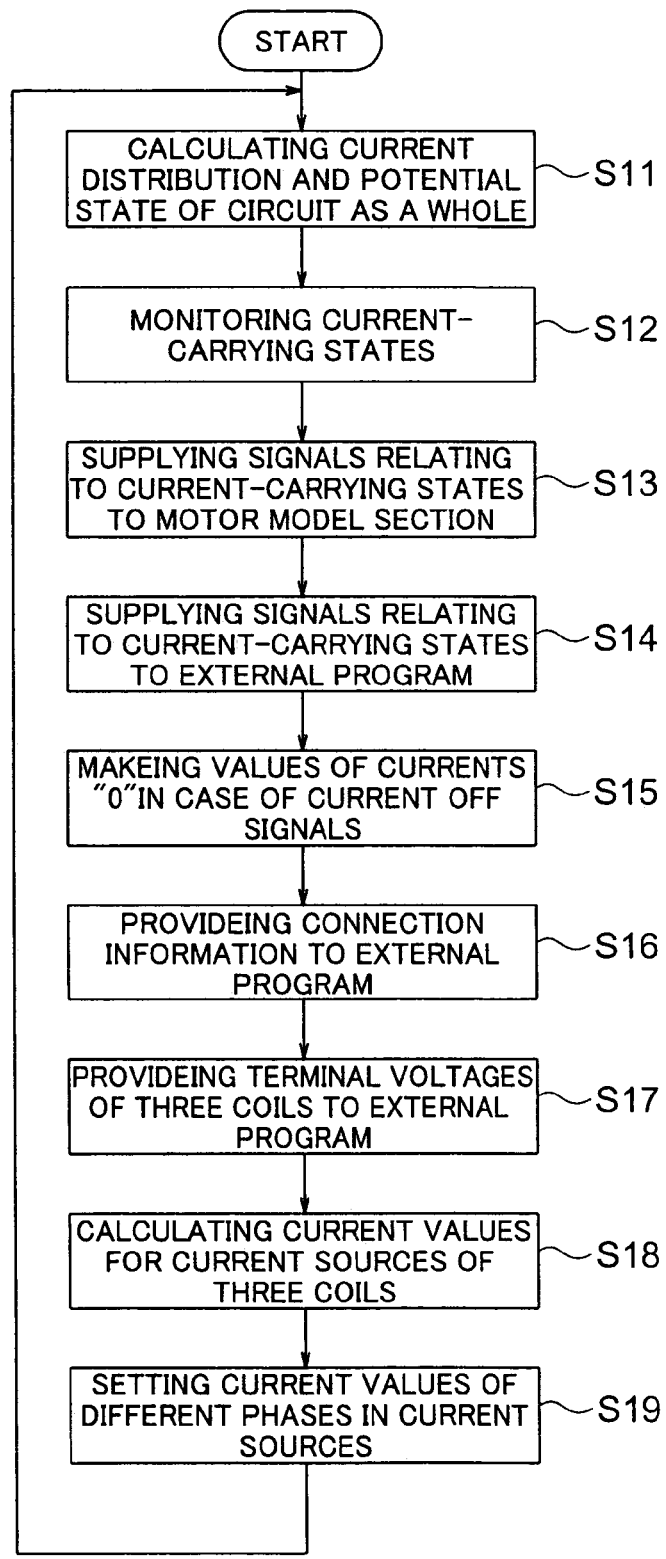
FIG. 18 is a flow chart for explaining the "ordinary drive state" of the circuit simulator according to the other embodiment.
Figure 19:
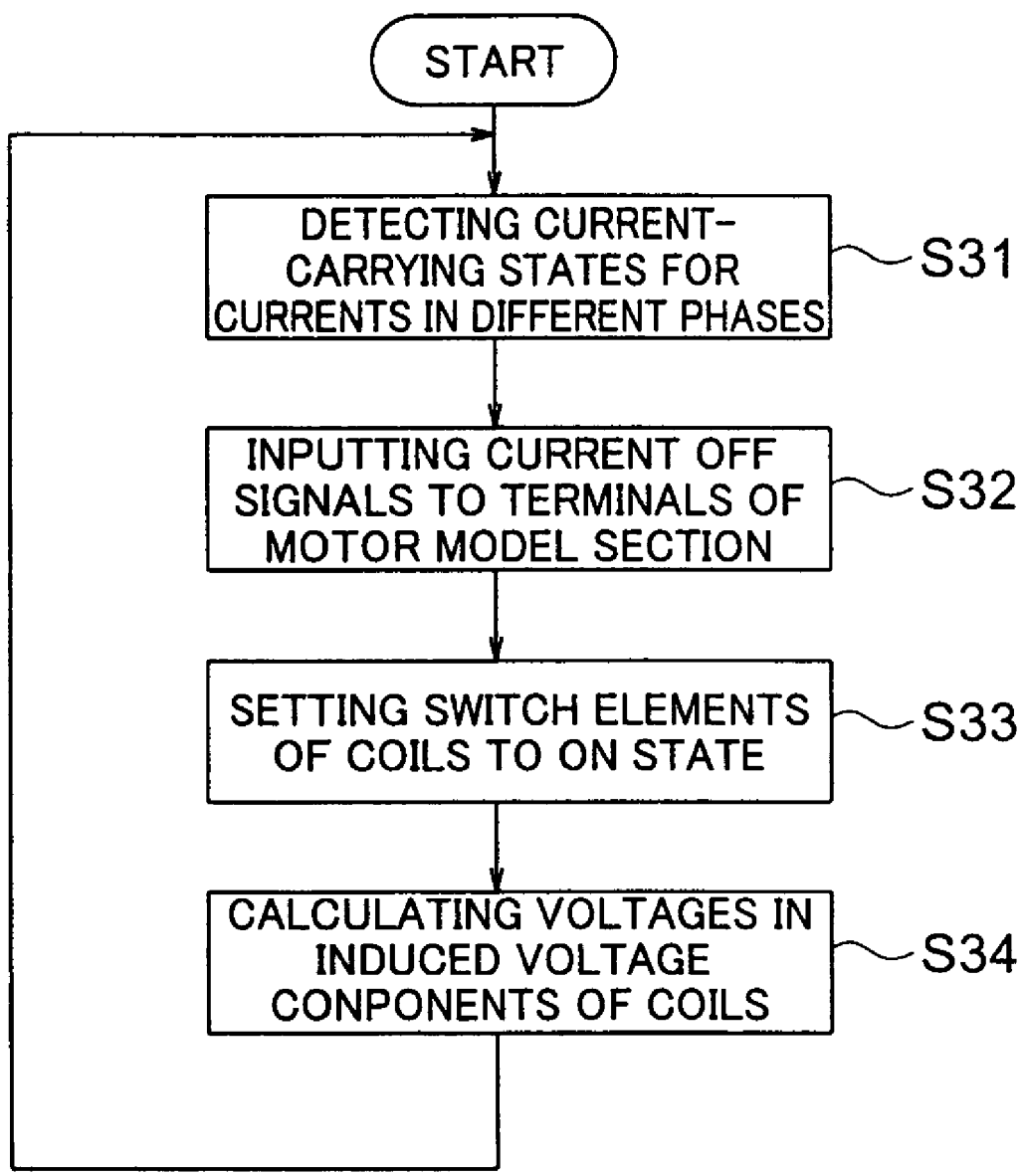
FIG. 19 is a flow chart for explaining the "operating state for calculation of the induced voltage" of the circuit simulator according to the other embodiment.

The flow chart shown in FIG. 18 shows the "ordinary drive state" of the circuit simulator 500. The "ordinary drive state" means the state where the motor model 510 operates as an equivalent circuit of an electric motor.

At the initial step S11, the circuit simulator 500 calculates the current distribution and potential state of the circuit as a whole including the motor model 510 and the control circuit 530. This calculation finds the ordinary operating characteristics as determined by the circuit simulator 500.

In the ordinary drive state of the circuit simulator 500, at a suitable timing, the current-carrying states of the currents of the different phases (U-phase, V-phase, and W-phase) of the three-phase alternating current supplied from the control circuit 530 to the motor model 510 are monitored (step S12). The current-carrying states of the currents of the different phases are monitored by the current detectors 550U, 550V, and 550W and the current value judgers 560U, 560V, and 560W. At step S12 for monitoring the current-carrying states of the currents of the different phases, when the values of the currents of the currents of the different phases are the current threshold value or less, off signals of current are output, while in other cases, on signals of current are output. Signals according to the current-carrying states of the currents of the different phases (off signals of current and on signals of current) are supplied to the terminals 511U, 511V, and 511W of the motor model 510 (step S13).

The signals according to the current-carrying states of the currents of the different phases are supplied through the terminals 511U, 511V, and 511W to the external program (nonlinear data base) 52 of the motor model 510 (step S14). In the external program 52, when "off signals of current" are supplied, processing is performed for forcibly making the values of the currents of the current sources 23 of the coils of the related phases "0" (step S15).

Next, the connection information of the three coils 11U, 11V, and 11W input to the three terminals 511U, 511V, and 511W is provided to the external program 52 (step S16). The connection information is given by the signal state of the signal SG1. Further, the input signal line group 54 provides the voltages across terminals of the three coils 11U, 11V, and 11W through the terminals 51U, 51V, and 51W to the external program 52 (step S17).

The external program (nonlinear data base) 52 calculates the values of the currents of the current sources 23 of three coils 11U, 11V, and 11W of the three phases while considering the connection structure of the coils 11U, 11V, and 11W of the three phases, that is, the Y-configuration or delta configuration, and in accordance with the law of conservation of current (step S18). In the calculation of the values of the currents of the current sources 23 of the different phases, when the above "off signals of current" are given, the values of the currents are forcibly made "0" in accordance with the procssing of the above step S15.

At the final step S19, the external program 52 gives the values of the currents of the phases found by calculation through the output signal line group 53 to the current sources 23 of the coils 11U, 11V, and 11W and sets the values of the currents of the current sources 23. After this, the flow chart returns to the initial step S11.

According to the operating characteristics of the above circuit simulator 500, the motor model 510 operating as an electric motor forcibly sets the current sources 23 to "0" when the current-carrying states of the three coils 11U, 11V, and 11W of the three phases are non-current carrying states. In the case where the three coils are connected in three phases like in a three-phase synchronous motor, even when the values of the currents are "0", the potential difference of the phases will strictly speaking never become "0" due to the error in numerical values. For this reason, in the configuration of a conventional circuit simulator, the nonlinear data base finds the values of the currents based on the potentials of the different phases and calculates the very small values of the current based on the very small value of voltage due to the error of the numerical values. The currents according to the calculated values of the currents are conducted to the resistance elements (R3) connected in parallel to the current sources 23 since the external circuit is open in state. Since the resistance elements (R3) are set to a large resistance values, extremely large potential appears to be generated at the two ends of the current sources 23, and thereby the calculation for the circuit simulator 500 in the computer fails. Therefore, in the circuit simulator 500 according to the present embodiment, as explained above, when the current-carrying states from the external control circuit 530 to the coils are non-current carrying states, the current sources 23 are controlled to be forcibly set to 0.

Further, according to the circuit simulator 500, whether the connection structure of the three coils 11U, 11V, and 11W of the three phases is a Y-configuration or delta configuration is considered and this linked to the external program 52 constituted by the nonlinear data base. Due to this, it is possible to accurately set the values of the currents of the current sources 23 of the different phases. When connecting a plurality of coils, individually evaluating the coils, and extracting the values of the currents from the nonlinear data base, if setting the values of the currents in the current sources for the circuit simulation, the law of conservation of current will not necessarily stand for the coils as a whole and the calculation is liable to become unstable. Therefore, in the external program 52 of the motor model 510 of the circuit simulator 500 according to the present embodiment, the values of the currents of the different phases are found while considering the connection structure of the three coils and based on the law of conservation of current. Due to this, it is possible to avoid the phenomenon of unstable analysis in circuit simulation and perform analysis stably.

Next, the "operating state for calculation of the induced voltage" of the circuit simulator 500 will be explained in accordance with the flow chart shown in FIG. 19. The "operating state for calculation of the induced voltage" means the operating state of the motor model 510 for calculating only the induced voltage for evaluating the performance of the generator. The circuit simulator 500 detects the current-carrying states of the different phases of the three-phase alternating current supplied from the control circuit 530 to the motor model 510 and judges whether they are in the above states.

At the initial step S31, the current-carrying states of the currents of the different phases of the three-phase alternating current are detected. The current-carrying states are detected by the above-mentioned current detectors 550U, 550V, and 550W and the current value judgers 560U, 560V, and 560W. When the motor model 510 becomes a state for calculating the induced voltage, the control circuit 530 is removed and the state becomes that of only the motor model 510. "Off signals of current" are forcibly set for the currents of the different phases.

The off signals of current are input to the terminals 511U, 511V, and 511W of the motor model 510 (step S32).

In the motor model 510, based on the off signals of current of the different phases input to the terminals 511U, 511V, and 511W, the above-mentioned generator state setter 65 sets the switch elements SW3 of the coils 11U, 11V, and 11W to the on state (step S33). Due to this, all of the current sources 23 of the three coils 11U, 11V, and 11W are separated from the motor model 510.

Next, the external program 52 calculates and sets the voltage values of the induced voltage components 13 of the three coils 11U, 11V, and 11W (step S34).

As explained above, according to the circuit simulator 500 according to the present embodiment, when the motor model 510 operates for calculation of the induced voltage, the current sources 23 of the different coils can be separated and only the induced voltage components 13 calculated. In this way, when it is self evident that the current-carrying states of the different phases of the three-phase alternating current supplied to the motor model 510 are all the non-current carrying states, it is possible to eliminate the current sources 23 of the inductance components 14 of the coils and calculate only the induced voltage components 13.

Based on the above, when connecting to a commercially available representative circuit simulator (PSIM) an electric motor (three-phase synchronous motor) having coils with variable inductance components, the model of an equivalent circuit of an electric motor according to the present embodiment is created based the models of the coils of the different phases as shown in FIG. 3. By configuring the circuit simulator 500 and motor model 510 in the above way, it is possible to apply a commercially available circuit simulator for analysis of an actual motor without problem.

Figure 20:
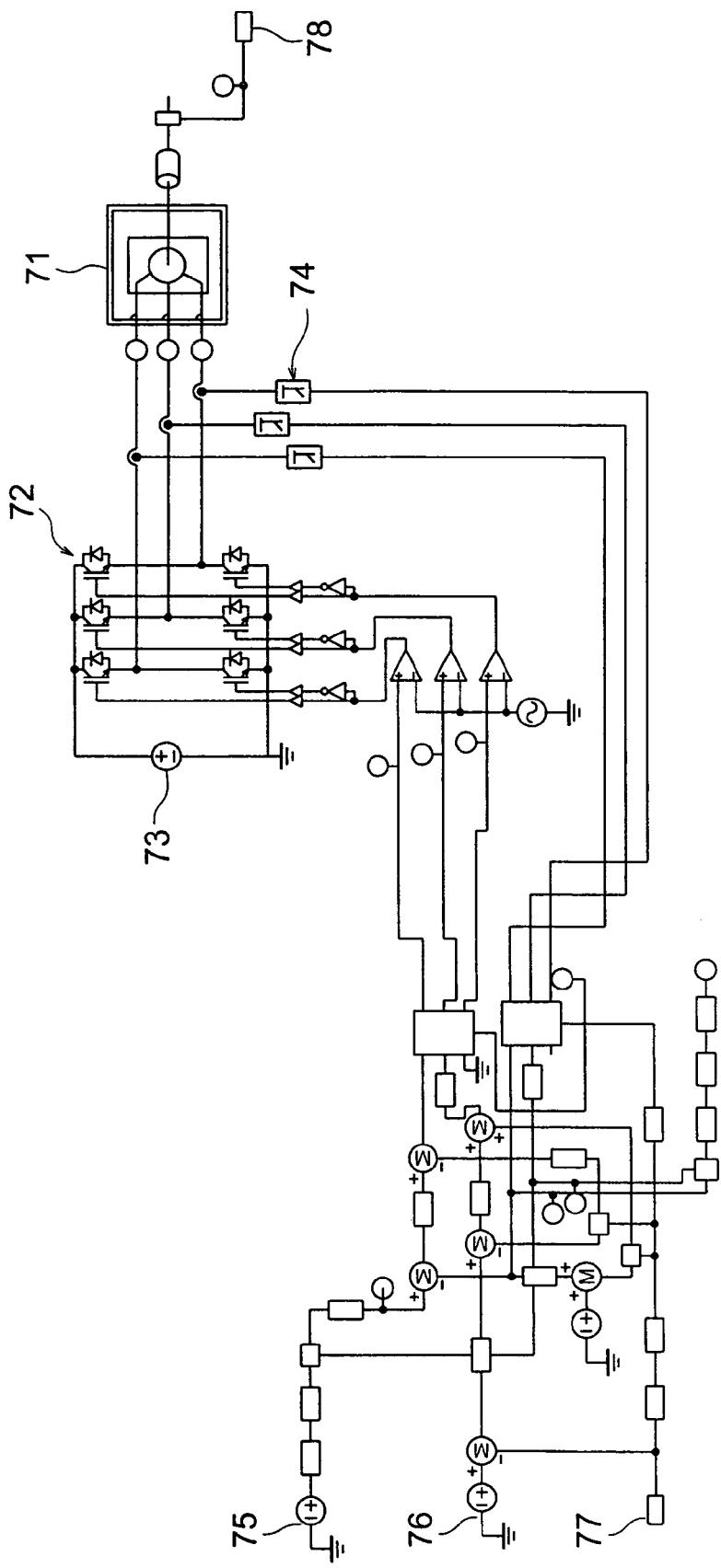
FIG. 20 is a circuit diagram showing an example of the overall configuration of a specific circuit of the circuit simulator.

FIG. 20 shows the actual equivalent circuit provided to the user by the commercially available circuit simulator (PSIM). The user sets the operating environment in the equivalent circuit of FIG. 20 displayed on the screen of the display device. In the circuit simulator shown in FIG. 20, 71 indicates the equivalent circuit of the motor portion (motor model 510). The equivalent circuit 71 of this motor is comprised of the circuit shown in FIG. 15. In the circuit simulator of FIG. 20, the circuit 72 is a bridge circuit (control circuit 530) for supplying the motor 71 with on/off voltages of different phases for driving the motor, 73 is a DC power source (for example 200V), 74 is a current monitor, 75 is a current phase designator, 76 is a target speed setter, and 77 and 78 are speed setters for the time of analysis.

Note that the circuit simulator and motor model according to the present invention can be similarly prepared using for example the other commercially available software Simulink® as well so long as a model of the circuit shown by the present invention can be created.

The present invention is utilized for practical analysis by a commercially available circuit simulator used for analysis of electric motors etc. without problem even when making the inductance components of the coils variable in the circuit simulator. Further, in the circuit simulator, even when currents supplied to the coils with the variable inductance components are not off, the circuit simulator can be used for practical analysis without problem.

The configurations, shapes, sizes (thicknesses), and layouts explained in the above embodiments are only shown schematically to an extent enabling the present invention to be understood and worked. Further, the numerical values and compositions (materials) are only shown for illustration. Therefore, the present invention is not limited to the explained embodiments and can be changed in various ways within the scope of the technical idea shown in the claims.

The present invention contains subject matter related to Japanese Patent Application No. 2005-4738 filed in the Japan Patent Office on Jan. 12, 2005 and Japanese Patent Application No. 2005-316428 filed in the Japan Patent Office on Oct. 31, 2005, the entire contents of which being incorporated herein by reference.

The invention claimed is:

1. A system for modeling a circuit, the system comprising:
a circuit simulator program stored on a computer-readable storage medium, and
a computer,
the circuit simulator program comprising instructions causing the computer to execute the circuit simulator program by preparing an electrical equivalent circuit as an analytic model for analyzing electrical equipment including a coil as an electrical circuit element by analyzing an operation of said electrical equipment by use of said electrical equivalent circuit concerning said analytic model,
wherein said coil included in said electrical equipment is expressed by said equivalent circuit based on an inductance component, said equivalent circuit expressing said analytic model for said electrical equipment, and
said inductance component being expressed by said equivalent circuit, said equivalent circuit comprising:
a current source,
a voltage extracting means for extracting voltage across terminals of said current source,
a current generating means for determining a value of the current of said current source based on the value of said extracted voltage extracted from said voltage extracting means, said extracted voltage value to be input to said current generating means fluctuating in calculation, and
a current generating means for determining a value of the current of said current source based on the value of said extracted voltage extracted from said voltage extracting means, said extracted voltage value to be input to said current generating means is fluctuating in calculation, and
wherein said inductance component of said coil provides a variable inductance device connected to said current source, said voltage extracting means and said current generating means eliminate an inductance value calculation failure caused by said current-carrying path.

2. The circuit simulator of claim 1, wherein said current-carrying path for carrying the regenerative current comprises:
two current-carrying paths comprised of diodes, resistance elements and switch elements and having opposite current-carrying directions, and
a circuit for controlling on/off operations of said switch elements of said two current-carrying paths at the time that said application voltage to said coil is turned off, in accordance with said current-carrying direction.

3. The circuit simulator of claim 1, wherein said current generating means is a data base expressed with voltage as input and a nonlinear electrical characteristic as output current.

4. The circuit simulator of claim 1, wherein said coil expressed by said equivalent circuit further includes equivalent circuit elements of a resistance component and induced voltage component.

5. The circuit simulator of claim 1, the simulation program comprising:
a basic simulation program for preparing said electrical equivalent circuit including said current source, said voltage extracting means and said current generating means in said equivalent circuit for said coil, and
a support simulation program different from the basic simulation program and for preparing an equivalent circuit for said current-carrying path and eliminating a calculation failure resulting from the basic simulation program.

6. A computer-readable storage medium storing a program for executing a circuit simulator on a computer, said program comprising instructions causing the computer to execute the circuit simulator by:
modeling electrical equipment in said circuit simulator, the electrical equipment including a coil as an electrical circuit element; and
modeling said coil with an equivalent circuit by an inductance component,
wherein said inductance component comprises:
a current source, voltage extracting means that extracts a voltage across terminals of said current source, current generating means that determines a current value of said current source depending upon said extracted voltage value extracted by said extracting means, said extracted voltage value to be input to said current generating means fluctuating in calculation, and a current-carrying path connected in parallel with said current source for eliminating fluctuations in said extracted voltage value by passing a regenerative current at a time that an application voltage to said coil is turned off, wherein said program is stored so that said inductance component is arranged as a variable without causing fluctuations through said current-carrying path.

7. The computer-readable storage medium of claim 6, said current-carrying path for carrying the regenerative current comprising:

two current-carrying paths comprising diodes, resistance elements, and switch elements and having opposite current-carrying directions; and a circuit for controlling on/off operations of the switch elements of said two current-carrying paths at the time of said off operation in accordance with the current-carrying direction.

8. The computer-readable storage medium of claim 6, said current generating means expresses a voltage value as input and a nonlinear electrical characteristic as output current.

9. The computer-readable storage medium of claim 6, said coil expressed by the equivalent circuit including, along with said inductance component, a resistance component and an induced voltage component.

10. A system for modeling a circuit, the system comprising:

a circuit simulator program stored on a computer-readable storage medium, and a computer, the circuit simulator program comprising instructions causing the computer to execute the circuit simulator program by preparing an electrical equivalent circuit as an analytic model for analyzing electrical equipment including a coil as an electrical circuit element by analyzing an operation of said electrical equipment by use of said electrical equivalent circuit concerning said analytic model, wherein inductance components expressed by said equivalent circuit comprise:

a current source, a voltage extracting means for extracting voltage across terminals of said current source, a current generating means for determining a value of the current of said current source based on the value of said extracted voltage extracted from said voltage extracting means, said extracted voltage value to be input to said current generating means fluctuating in calculation, and a resistance element connected in parallel with said current source for attenuating fluctuations in said extracted voltage value at a time that an application voltage to said coil is turned off, and a switch element for making said current source effective on said equivalent circuit during an off state and ineffective during an on state, wherein, in an event that a non-current-carrying state occurs in said coil, said current source is separated from said equivalent circuit by placing said switch element in the on state.

11. The circuit simulator of claim 10, wherein said current generating means is a data base expressed with any physical quantity as input and with a nonlinear electrical characteristic as output current.

12. The circuit simulator of claim 10, wherein each equivalent circuit for a coil further includes a second resistance component and induced voltage component.

13. The circuit simulator of claim 10, wherein said simulator is provided with a current judging means for judging the current-carrying states of currents supplied to said three coils, and said current generating means makes the values of the currents of said current sources "0" when said voltage extracting means receives as input off signals of current output from said current judging means.

14. The circuit simulator of claim 13, further provided with a switching means for placing all of said switch elements of said three coils in the on state when said current judging means outputs off signals of current for all of said three coils.

15. The circuit simulator of claim 10, further provided with connection switching means for arranging an equivalent connection structure of said three coils in a Y-configuration or delta configuration.

16. The circuit simulator of claim 10, the simulation program comprising:

a basic simulation program for preparing said electrical equivalent circuit including said current source, said voltage extracting means and said current generating means in said equivalent circuit for said coil, and a support simulation program different from said basic simulation program and for preparing an equivalent circuit for said resistance element and said switch element and eliminating a calculation failure resulting from the basic simulation program, and separating said current source from said equivalent circuit for said coil in the event that a non-current-carrying state occurs in said coil.

17. A computer-readable storage medium storing a circuit simulator program executed on a computer, the program comprising instructions causing the computer to execute the circuit simulator by:

preparing an electrical equivalent circuit as an analytic model for analyzing electrical equipment including a coil as an electrical circuit element, said electrical equipment being a model of an electric motor or generator including three coils; and analyzing an operation of said electrical equipment by use of said electrical equivalent circuit; and modeling separate equivalent circuits for each of said three coils by inductance components;

modeling said inductance components including operating an apparatus that comprises:

a current source outputting a current, a voltage extracting means for extracting a voltage across terminals of said current source, a current generating means for determining the value of the current output by said current source based on the extracted voltage extracted by said voltage extracting means, said extracted voltage value to be input to said current generating means fluctuates in calculation, and a resistance element connected in parallel with said current source for attenuating fluctuations in said extracted voltage value at a time that an application voltage to said coil is turned off, and a switch element for making said current source effective on said equivalent circuit during an off state and ineffective during an on state.

18. The computer-readable storage medium of claim 17, modeling said current generating means by a data base expressed with voltage or any other physical quantity as input and a nonlinear electrical characteristic as output current.

19. The computer-readable storage medium of claim 17, each equivalent circuit for each coil by including, along with said inductance component, a second resistance component and induced voltage component.

20. The computer-readable storage medium of claim 17, the apparatus further comprising:
- a current judging means for judging the current-carrying states of the currents supplied to said three coils; and
- current generating means setting the values of the currents of said current sources "0" when said voltage extracting means receives as input off signals of current output from said current judging means.

21. The computer-readable storage medium of claim 20, the apparatus further comprising:
- a switching means for placing all of the switch elements of said three coils in the on state when said current judging means outputs off signals of current for all of said three coils.

22. The computer-readable storage medium of claim 17, modeling separate equivalent circuits for each of said three coils by inductance components comprising using a device that comprises:
- a connection switching means for arranging the connection structure of said three coils in a Y-configuration or delta configuration.

* * * * *